(12) United States Patent
Park et al.

(10) Patent No.: US 7,342,275 B2
(45) Date of Patent: Mar. 11, 2008

(54) SEMICONDUCTOR DEVICE AND METHOD OF MANUFACTURING THE SAME

(75) Inventors: Byung-Jun Park, Gyeonggi-do (KR); Ji-Young Kim, Gyeonggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 11/279,080

(22) Filed: Apr. 7, 2006

(65) Prior Publication Data
US 2006/0202340 A1 Sep. 14, 2006

Related U.S. Application Data

(62) Division of application No. 10/688,017, filed on Oct. 16, 2003, now Pat. No. 7,052,983.

(30) Foreign Application Priority Data
Jan. 22, 2003 (KR) ................. 2003-4358

(51) Int. Cl.
*H01L 27/108* (2006.01)
(52) U.S. Cl. ..................... 257/306; 257/382
(58) Field of Classification Search ............. 257/306, 257/382, 900
See application file for complete search history.

(56) References Cited

U.S. PATENT DOCUMENTS

| 5,895,948 A | 4/1999 | Mori et al. |
| 6,030,894 A | 2/2000 | Hada et al. |
| 6,211,091 B1 | 4/2001 | Lien et al. |
| 6,218,272 B1 * | 4/2001 | Yeom et al. ........ 438/586 |

(Continued)

FOREIGN PATENT DOCUMENTS

KR 1999-84959 12/1999

(Continued)

OTHER PUBLICATIONS

English language abstract of Korean Publication No. 1999-84959, Feb. 2001.

(Continued)

*Primary Examiner*—Mark V. Prenty
(74) *Attorney, Agent, or Firm*—Marger Johnson & McCollom, P.C.

(57) ABSTRACT

Wirings including first conductive layer patterns and insulating mask layer patterns are formed on a substrate. Insulating spacers are formed on sidewalls of the wirings. Self-aligned contact pads including portions of a second conductive layer are formed to contact with surfaces of the insulating spacers and to fill up a gap between the wirings. An interlayer dielectric layer is formed on the substrate where the contact pads are formed and is then partially etched to form contact holes exposing the contact pads. A selective epitaxial silicon layer is formed on the contact pads exposed through the contact holes to cover the insulating mask layer patterns. Thus, a short-circuit between the lower wiring and an upper wiring formed in the contact holes is prevented.

21 Claims, 26 Drawing Sheets

U.S. PATENT DOCUMENTS

| | | |
|---|---|---|
| 6,297,091 B1 | 10/2001 | Roh et al. |
| 6,468,853 B1 | 10/2002 | Balasubramanian et al. |
| 6,472,303 B1 | 10/2002 | Weon et al. |
| 6,818,537 B2 | 11/2004 | Cheong |
| 7,052,983 B2 * | 5/2006 | Park et al. .................. 438/607 |
| 2001/0005623 A1 | 6/2001 | Kim et al. |
| 2002/0186601 A1 | 12/2002 | Lee et al. |
| 2003/0003718 A1 | 1/2003 | Park et al. |
| 2003/0022486 A1 | 1/2003 | Wu |

FOREIGN PATENT DOCUMENTS

| | | |
|---|---|---|
| KR | 2002-58285 | 7/2002 |

OTHER PUBLICATIONS

English language abstract of Korean Publication No. 2002-58285, Jul. 2002.

* cited by examiner

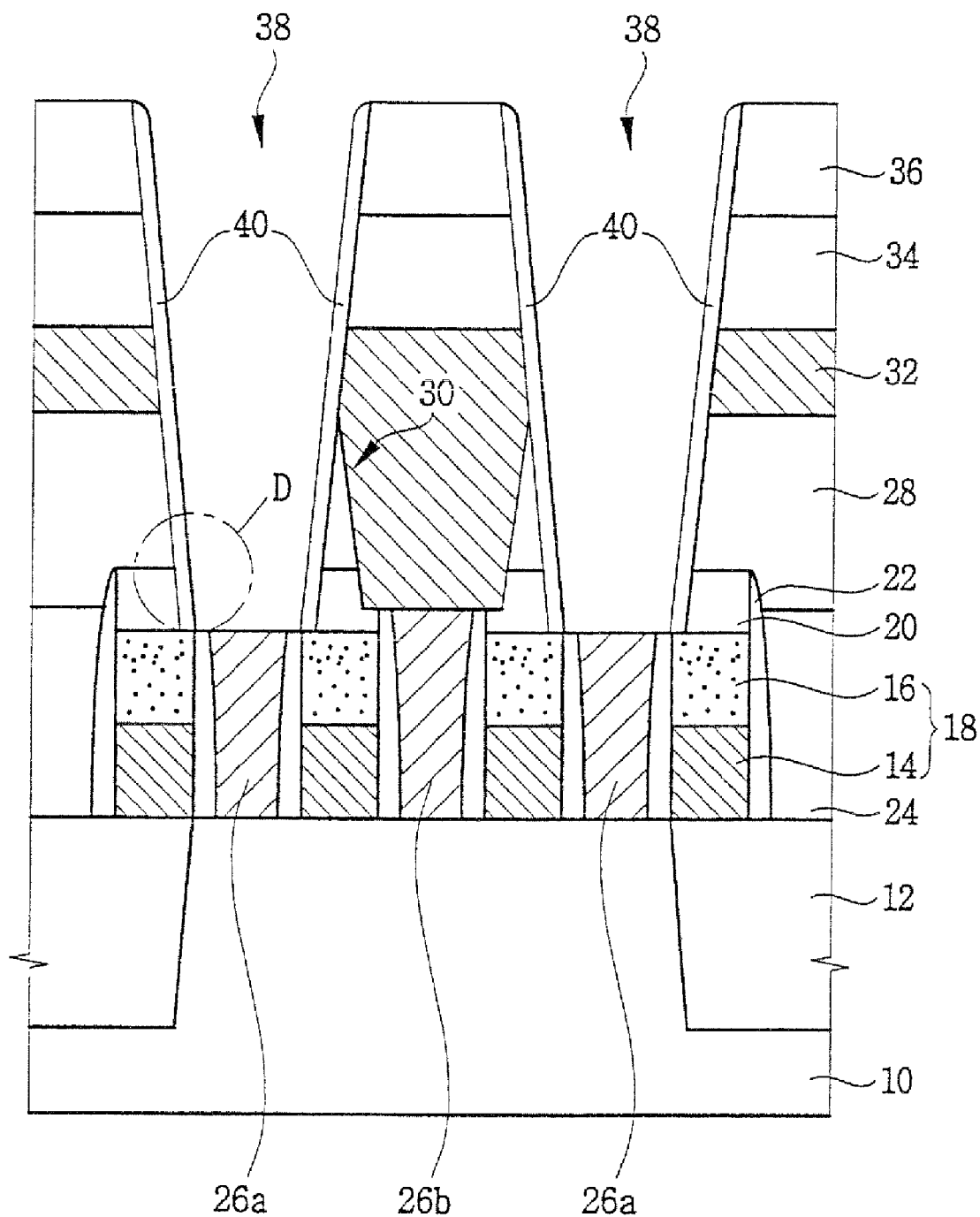

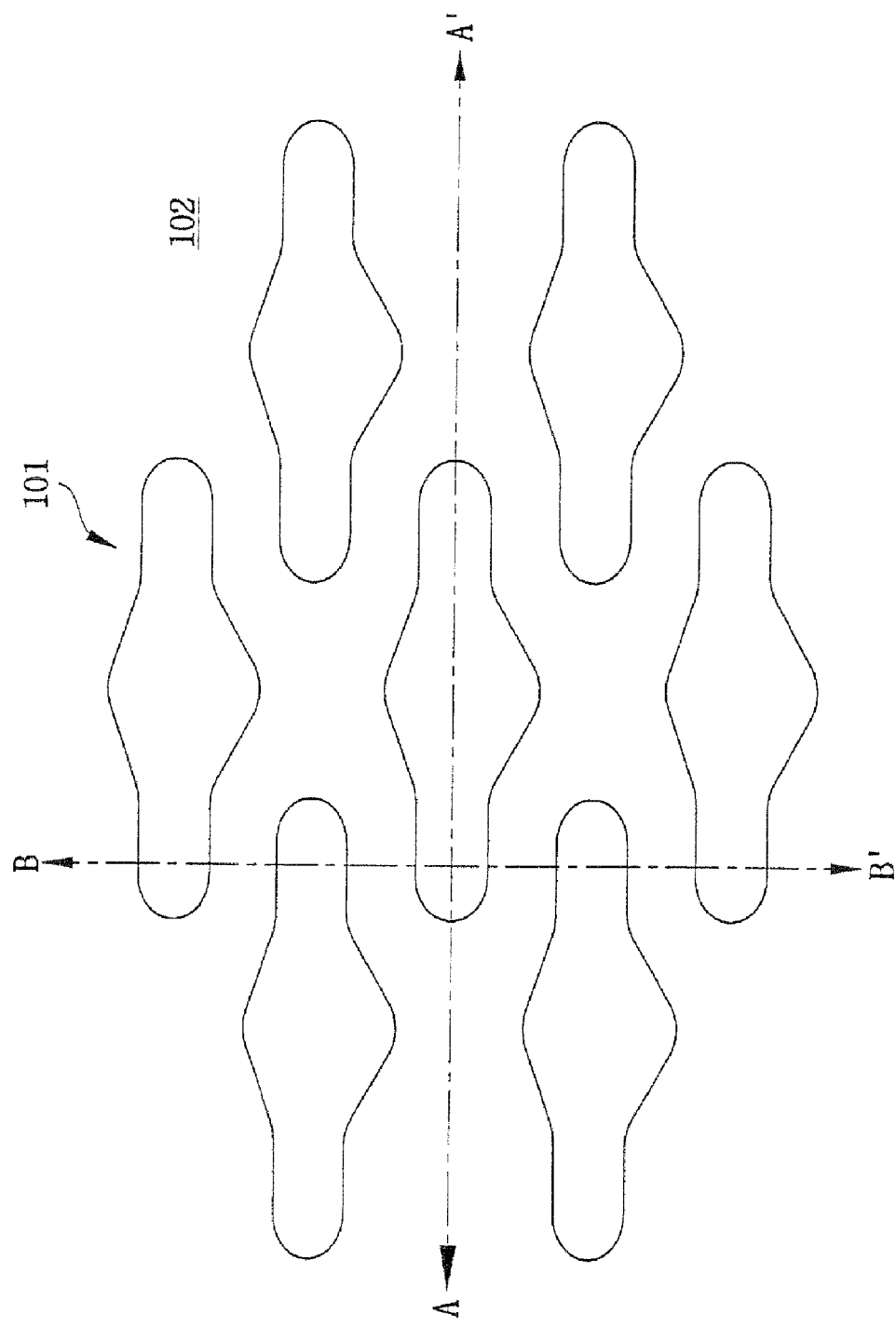

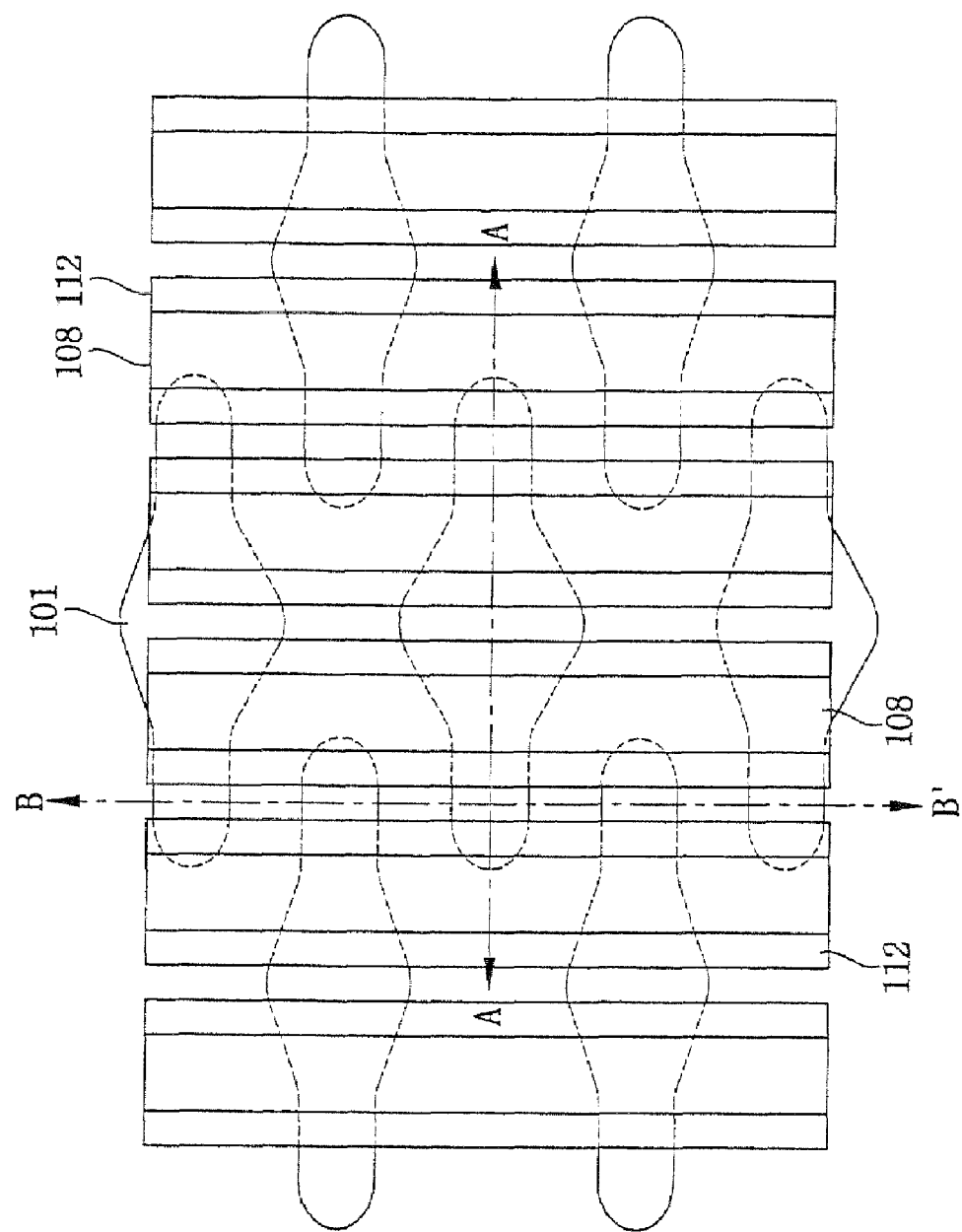

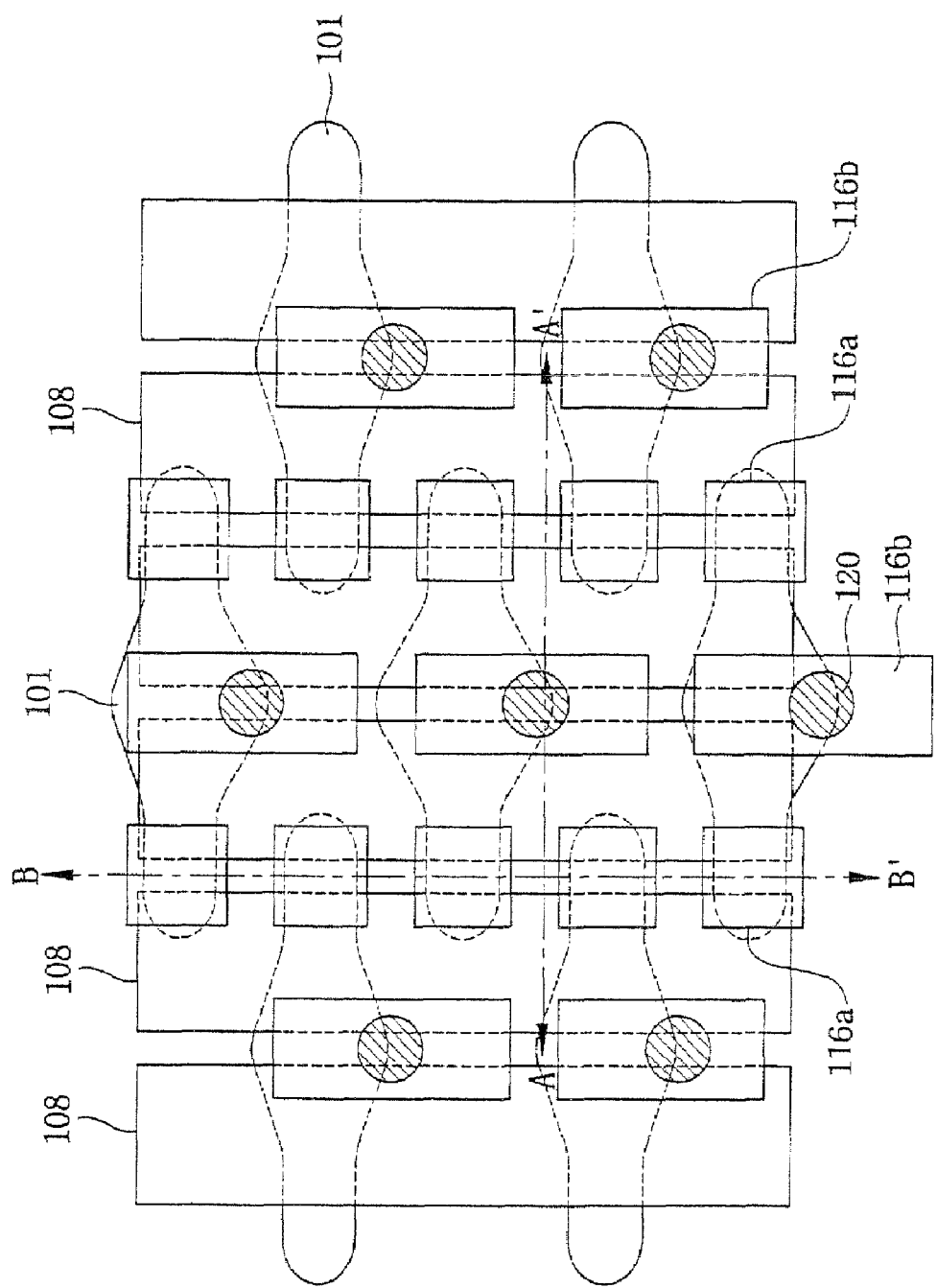

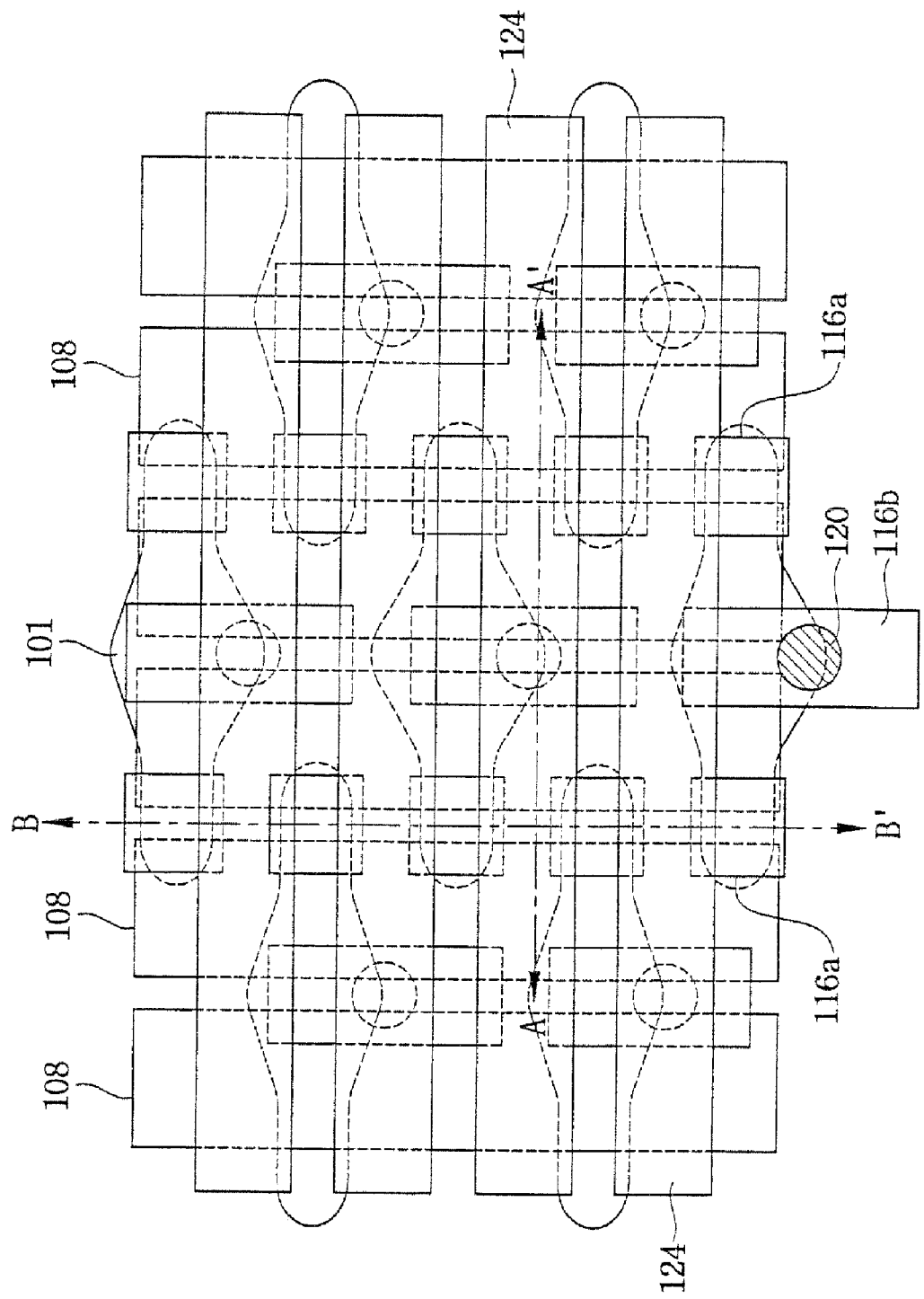

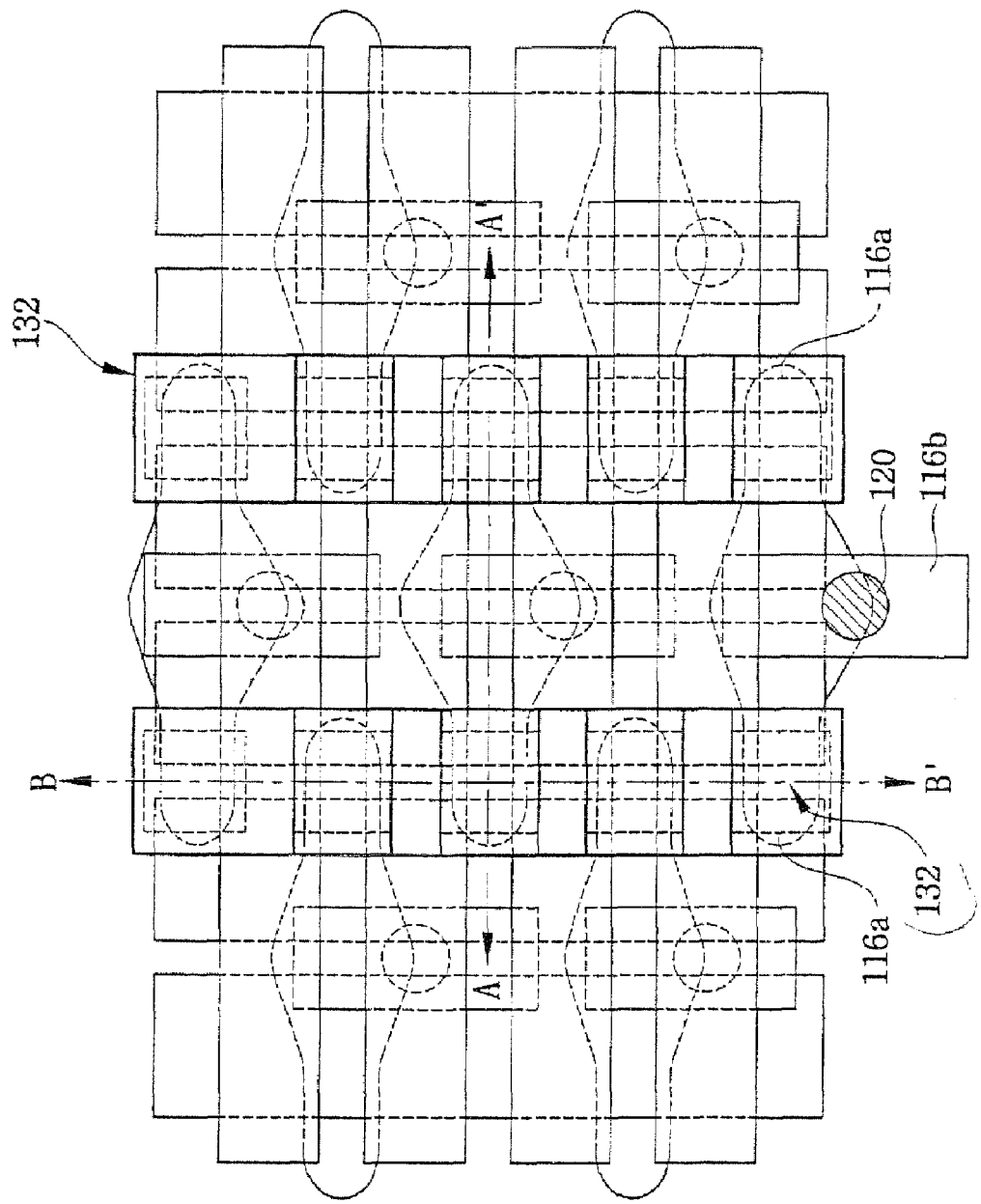

SEMICONDUCTOR DEVICE AND METHOD OF MANUFACTURING THE SAME

CROSS REFERENCE TO RELATED APPLICATION

This is a Divisional of U.S. patent application Ser. No. 10/688,017, filed on Oct. 16, 2003, now U.S. Pat. No. 7,052,983, which claims priority from Korean Patent Application No. 2003-4358, filed on Jan. 22, 2003, the contents of which are incorporated by reference.

BACKGROUND OF THE INVENTION

1. Field of the Invention

This disclosure relates to a semiconductor device, and more particularly, to a dynamic random access memory (DRAM) and a method of manufacturing the same.

2. Description of the Related Art

As techniques for manufacturing semiconductor devices develop and the applications for memory devices expand, memory devices having large capacities are required. In particular, the integration density of a DRAM device, wherein a memory cell is composed of one capacitor and one transistor, has remarkably improved.

As the integration density of semiconductor device increases, the size of contact hole connecting one element to another element or one layer to another layer decreases, but the thickness of an interlayer dielectric layer increases. Thus, the aspect ratio of the contact hole, i.e., the ratio between its height to its diameter, increases and an alignment margin of the contact hole decreases in a photolithography process. As a result, the formation of small contact holes by conventional methods becomes very difficult.

In DRAM devices, a technique for forming landing pads is widely used to reduce the aspect ratio of a contact hole, and a self-aligned contact (SAC) structure is applied to a pattern having a feature size of about 0.1 m or less to settle short-circuit problems caused by the decrease of an alignment margin of the contact hole.

FIGS. 1A and 1B are cross-sectional diagrams illustrating a conventional method of manufacturing a DRAM device having SAC pads.

Referring to FIG. 1A, a semiconductor substrate 10 is divided into active regions and isolation regions by an isolation process such as a trench isolation process. A thin gate oxide layer (not shown) is grown on the surfaces of the active regions by a thermal oxidation process. Gate electrodes 18 of metal oxide semiconductor (MOS) transistors serving as word lines are formed on the gate oxide layer. Preferably, each of the gate electrodes 18 is formed to have a polycide structure including a polysilicon layer 14 doped with an impurity at a high concentration and a tungsten silicide layer 16 formed on the polysilicon layer 14.

The gate electrode 18 includes a gate mask layer 20 formed on the tungsten layer 16 and a gate spacer 22 formed on a sidewall of the gate electrode 18. The gate mask layer 20 and the gate spacer 22 are formed using silicon nitride.

Source/drain regions (not shown) of the MOS transistors are formed in the surface portions of the substrate 10 exposed between the gate spacers 22. The source/drain regions are formed via an ion implantation process using the gate electrodes 18 and the gate spacers 22 as masks.

A first interlayer dielectric layer 24 is formed on the surface of the substrate 10 including the MOS transistors formed thereon. The first interlayer dielectric layer 24 is etched using bar-type mask patterns including openings that expose the active regions when the surfaces of the source/drain regions between the gate electrodes 18 are exposed.

A first conductive layer is formed on the first interlayer dielectric layer 24 using doped polysilicon to fill up the openings. The first conductive layer is planarized via a chemical mechanical polishing (CMP) process when the surfaces of the gate mask layers 20 are exposed. As a result, first and second contact pads 26a and 26b are formed in the openings. The first and second contact pads 26a and 26b make contact with the source/drain regions. In addition, the first and second contact pads 26a and 26b are self-aligned relative to the gate electrodes 18.

A second interlayer dielectric layer 28 composed of silicon oxide is formed on the first interlayer dielectric layer 24 and on the contact pads 26a and 26b. The second interlayer dielectric layer 28 is then planarized via a CMP process or an etch-back process. The second interlayer dielectric layer 28 is partially etched by a photolithography process so that bit line contact holes 30 exposing the second contact pads 26b are formed over the drain regions.

A second conductive layer and a silicon nitride layer are sequentially formed on the second interlayer dielectric layer 28 to fill up the bit line contact holes 30. The silicon nitride layer and the second conductive layer are patterned via a photolithography process so that bit lines 32 including bit line masks are formed on the second interlayer dielectric layer 28.

A third interlayer dielectric layer 36 is formed on the entire surface of a resultant structure using silicon oxide. The third interlayer dielectric layer 36 is then planarized via a CMP process or an etch-back process. The third interlayer dielectric layer 36 and the second interlayer dielectric layer 28 are partially etched by a photolithography process such that storage node contact holes 38 exposing the first contact pads 26a are formed over the source regions. Here, the storage node contact holes 38 are formed to have a line shape so that the first contact pads 26a adjacent to one another in a direction identical to the gate direction are simultaneously exposed.

Referring to FIG. 1B, a silicon nitride layer is formed in the storage node contact holes 38 and on the third interlayer dielectric layer 36. The silicon nitride layer is then anisotropically etched to form contact spacers 40 on the inner sidewalls of the storage node contact holes 38.

A third conductive layer composed of doped polysilicon is formed to fill the storage node contact holes 38 on the third interlayer dielectric layer 36. The third conductive layer is then planarized via a CMP process when the surface of the third interlayer dielectric layer 36 is exposed. Accordingly, storage node contact plugs (not shown) separated into node units are formed in the storage node contact holes 38, respectively.

According to the conventional method, the recesses of the silicon nitride gate mask layers 20 are formed during the etching process for forming the SAC pads 26a and 26b, and also during the CMP process for separating the contact pads 26a and 26b into node units. Furthermore, the recesses of the gate mask layers 20 are generated during the etching process for forming the contact spacers 40. Hence, the gate mask layers 20 do not sufficiently protect the underlying gate electrodes 18. When the thickness of the gate mask layer 20 is increased to resolve this problem, gate notching may occur due to a low etching selectivity between the photoresist film and the silicon nitride layer.

Since the initial width of the gate mask layer 20 is limited, the width of the gate mask layer 20 decreases continuously as the etching process for forming the SAC pads and subsequent processes are carried out, thereby exposing edge portions of the gate electrodes 18. As a result, the bit lines 32 may be electrically short-circuited with the gate electrodes 18 (refer to portion "C" in FIG. 1A) or the storage node contact plugs may be electrically short-circuited with the gate electrodes 18 (refer to portion "D" in FIG. 1B).

SUMMARY OF THE INVENTION

It is a first feature of the present invention to provide a semiconductor device which can prevent an electrical short-circuit between a lower wiring and an upper wiring.

It is a second feature of the present invention to provide a method of manufacturing a semiconductor device for preventing an electrical short-circuit between a lower wiring and an upper wiring.

It is a third feature of the present invention to provide a method of manufacturing a DRAM device which can prevent an electrical short-circuit between a storage node contact and a gate electrode or between a bit line contact and the gate electrode.

BRIEF DESCRIPTION OF THE DRAWINGS

The above and other features and advantages of the invention will become more apparent to those of ordinary skill in the art by describing in detail preferred embodiments thereof with reference to the attached drawings.

FIGS. 1A and 1B are cross-sectional diagrams illustrating a method of manufacturing a DRAM device according to the conventional method.

DETAILED DESCRIPTION OF THE INVENTION

The invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. The relative thickness of layers in the illustrations may be exaggerated for purposes of describing the invention.

FIGS. 2A to 2E are cross-sectional diagrams illustrating a method of manufacturing a semiconductor device according to an embodiment of the invention.

Figure 1A:
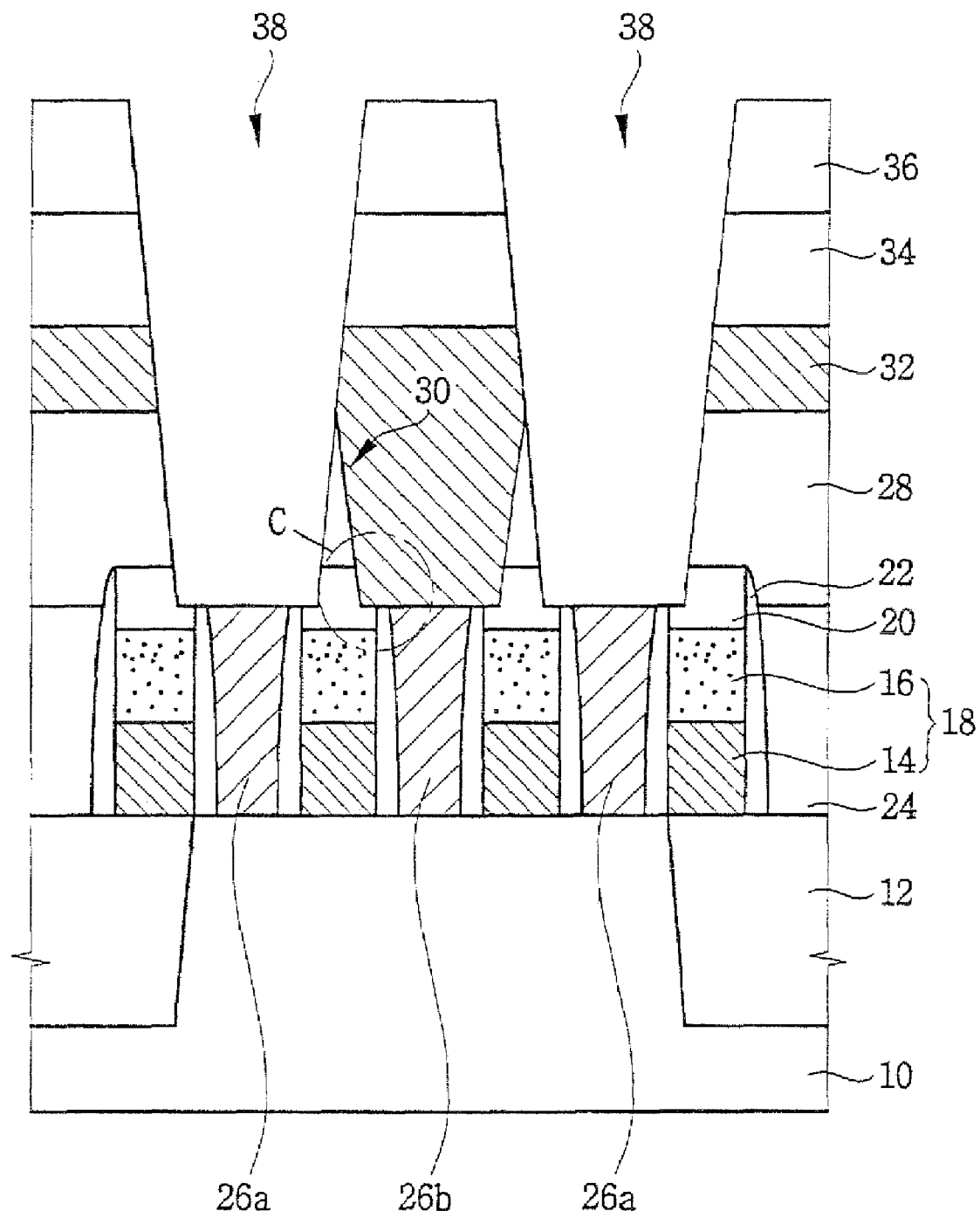
Figure 2A:
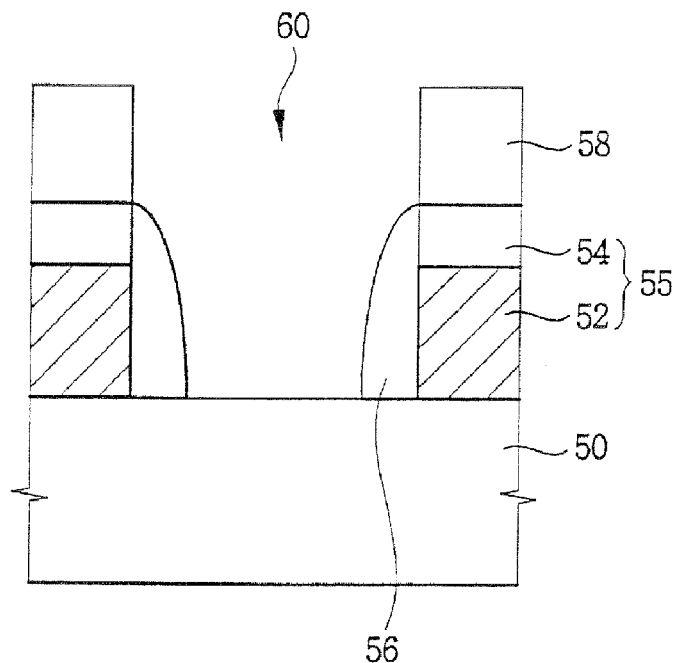
FIGS. 2A to 2E are cross-sectional diagrams illustrating a method of manufacturing a semiconductor device according to an embodiment of the invention.

Referring to FIG. 2A, a plurality of wirings 55 is formed on a semiconductor substrate 50. The wirings 55 are separated from one another. Each of the wirings 55 includes a first conductive layer pattern 52 and an insulating mask layer pattern 54 that includes a silicon nitride based material. The first conductive layer pattern 52 includes a doped polysilicon or a metal. Alternatively, the first conductive layer pattern 52 may be formed to have a composite layer including a first film of doped polysilicon and a second film of metal silicide.

An insulating layer is formed on the substrate 50 including the wirings 55. The insulating layer is formed using a silicon nitride based material. The insulating layer is then anisotropically etched to form spacers 56 on the sidewalls of the wirings 55, respectively.

A first interlayer dielectric layer 58 is formed on the spacers 56, the wirings 55 and the substrate 50 using a silicon oxide based material. The first interlayer dielectric layer 58 is anisotropically etched using mask patterns, e.g., photoresist patterns having openings 60 exposing contact regions. In this case, the first interlayer dielectric layer 58 is etched using an etching gas that has a high etching selectivity relative to silicon nitride, thereby exposing the surface of the substrate 50 between the adjacent wirings 55. Preferably, the first interlayer dielectric layer 58 is etched using bar-shaped mask patterns when the surface of the substrate between the wiring 55 and the adjacent wiring is exposed. Here, the mask patterns include the openings 60 that open at least two contact regions different from each other.

Figure 2B:
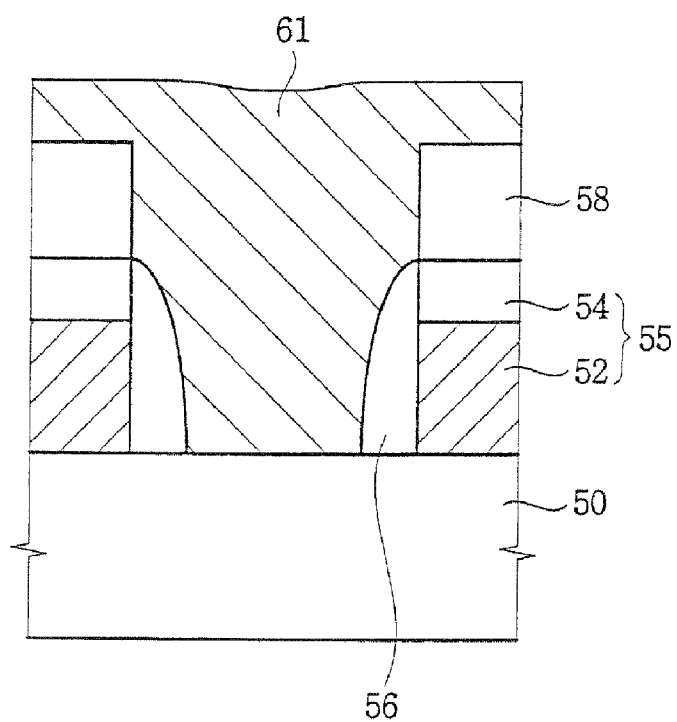

Referring to FIG. 2B, a second conductive layer 61 is formed on the first interlayer dielectric layer to fill up the openings 60. Preferably, the second conductive layer 61 is formed using polysilicon doped with an impurity at a high concentration.

Figure 2C:
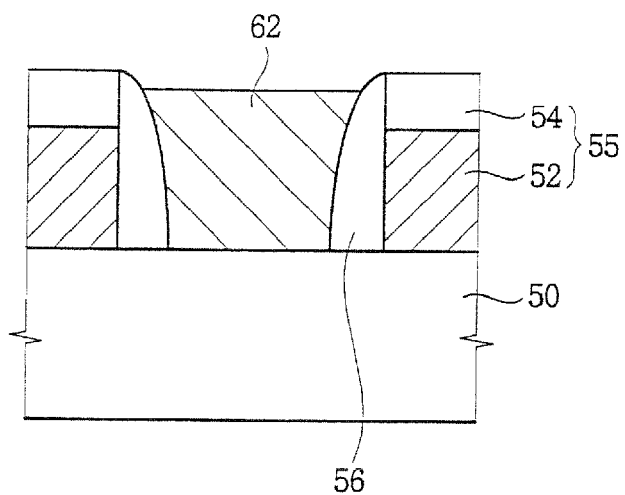

Referring to FIG. 2C, the second conductive layer 61 and the first interlayer dielectric layer 58 are planarized by a CMP process, an etch-back process, or a mixed process of a CMP and an etch-back when the surfaces of the insulating mask layer patterns 54 of the wirings 55 are exposed, thereby forming SAC pads 62 making contact with the surfaces of the spacers 56. The gaps between the wirings 55 are filled with the SAC pads 62. Preferably, at least two different SAC pads 62 are formed so that the SAC pads 62 make contact with at least two different contact regions, respectively.

Figure 2D:
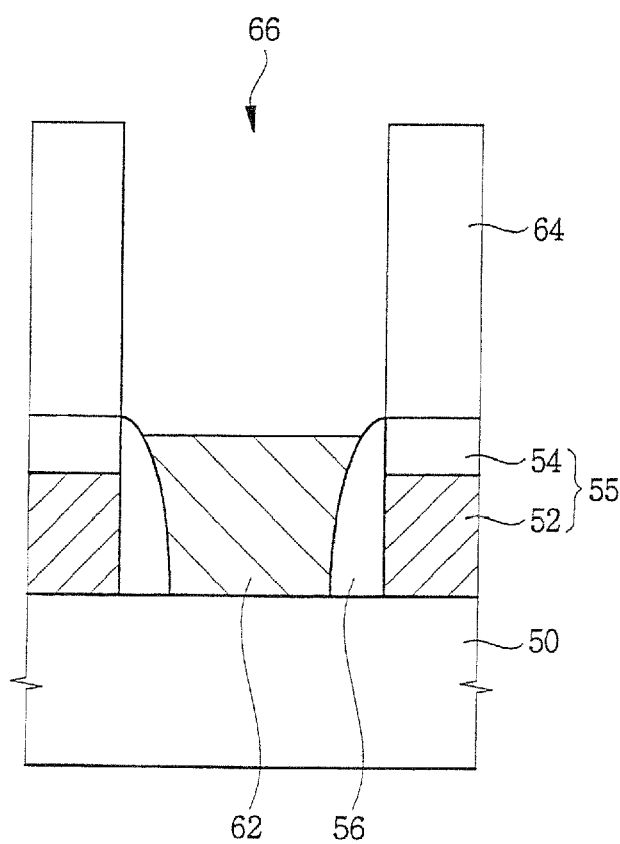

Referring to FIG. 2D, a second interlayer dielectric layer 64 is formed on the contact pads 62, the wirings 55 and the first interlayer dielectric layer 58 using a silicon oxide based material. The second interlayer dielectric layer 64 is then partially etched by a photolithography process such that contact hole 66 exposing one of the contact pads 62 is formed. Here, the contact hole 66 may be formed to have a circular shape corresponding to that of the contact pad 62 or formed to have a line shape exposing one contact pad 62 and adjacent contact pads 62 in a direction parallel to that of the wirings 55.

Figure 2E:
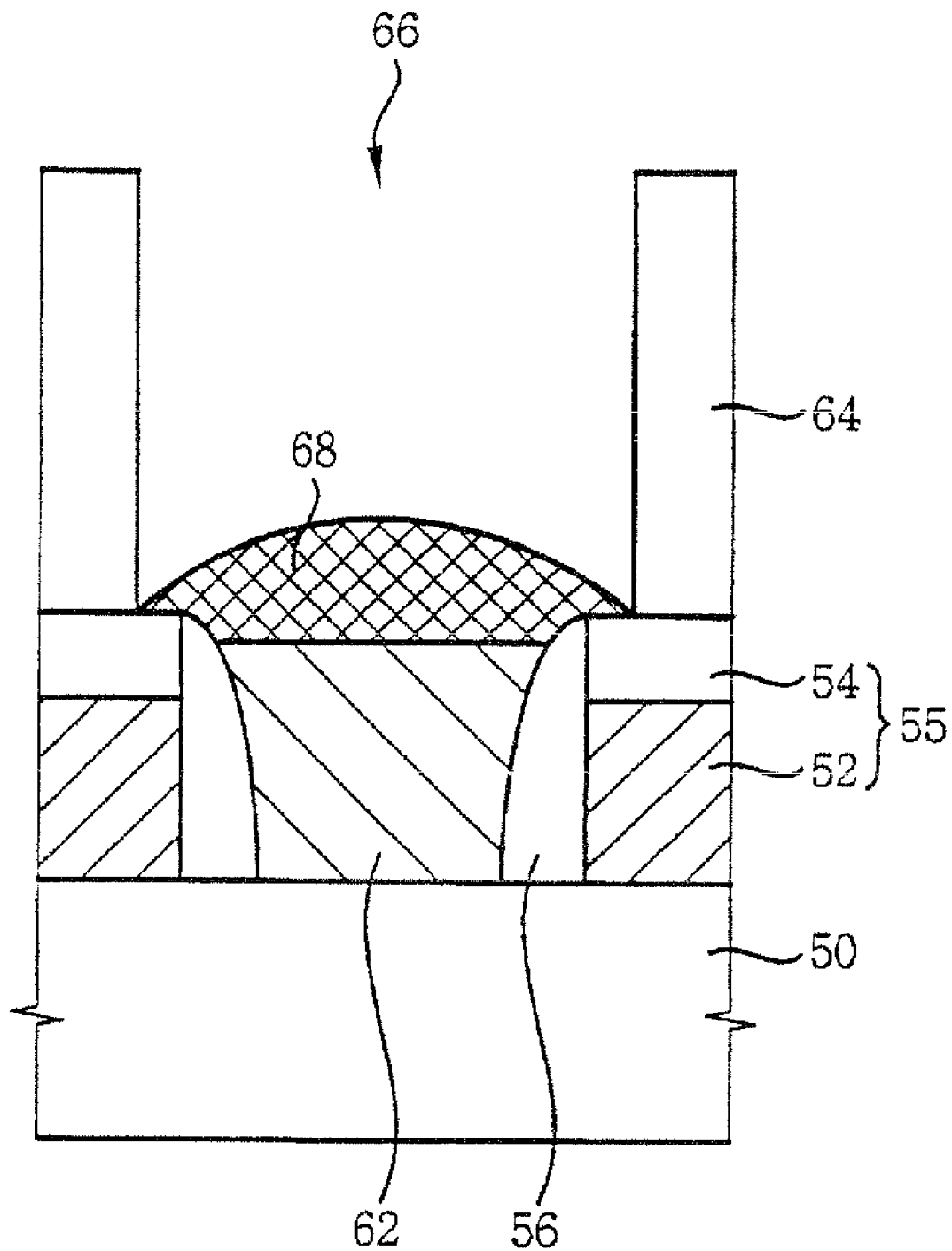

Referring to FIG. 2E, a selective epitaxial silicon layer 68 is grown on the surface of the contact pad 62 exposed by the contact hole 66 such that the selective epitaxial silicon layer 68 is thick enough to cover the insulating mask layer patterns 54 of the wirings 55.

Though it is not shown in the figures, a material having an etching selectivity relative to the second interlayer dielectric layer 64, e.g., silicon nitride, is continuously deposited on the second interlayer dielectric layer 64 and in the contact hole 66 to form a silicon nitride layer. The silicon nitride layer is then anisotropically etched using the selective epitaxial silicon layer 68 as an etching stopper to form contact spacers including portions of the silicon nitride layer on the inner sidewall of the contact hole 66. Here, the selective epitaxial silicon layer 68 protects the insulating mask layer patterns 54 that enclose the underlying wirings 55 during a subsequent etching process.

A third conductive layer, e.g., a doped polysilicon layer, is formed on the second interlayer dielectric layer 64 to fill up the contact hole 66. The third conductive layer is planarized by a CMP process, an etch-back process or a mixed process of a CMP and an etch-back when the surface of the second interlayer dielectric layer 64 is exposed, thereby forming a contact plug electrically connecting the exposed contact pad 62 to an upper wiring that is successively formed in the contact hole 66. Alternatively, after a third conductive layer composed of doped polysilicon or metal is formed on the second interlayer dielectric layer 64 to fill up the contact hole 66, the third conductive layer is patterned by a photolithography process so that an upper wiring is electrically connected to the exposed contact pad 62 through the contact hole 66.

According to this embodiment, after forming the contact hole 66 exposing the SAC pad 62, the selective epitaxial silicon layer 68 is formed on the exposed contact pad 62 to cover the insulating mask layer patterns 54 enclosing the underlying wirings 55. Thus, due to the selective epitaxial silicon layer 68, the recess of the insulating mask layer pattern 54 is not formed during a subsequent etching process for forming the contact spacers. As a result, the lower wirings 55 are not electrically short-circuited with the contact plug or the upper wiring in the contact hole 66.

FIGS. 3A to 11B are plan diagrams and cross-sectional diagrams illustrating a method of manufacturing a semiconductor device in accordance with another embodiment of the invention.

Figure 3B:
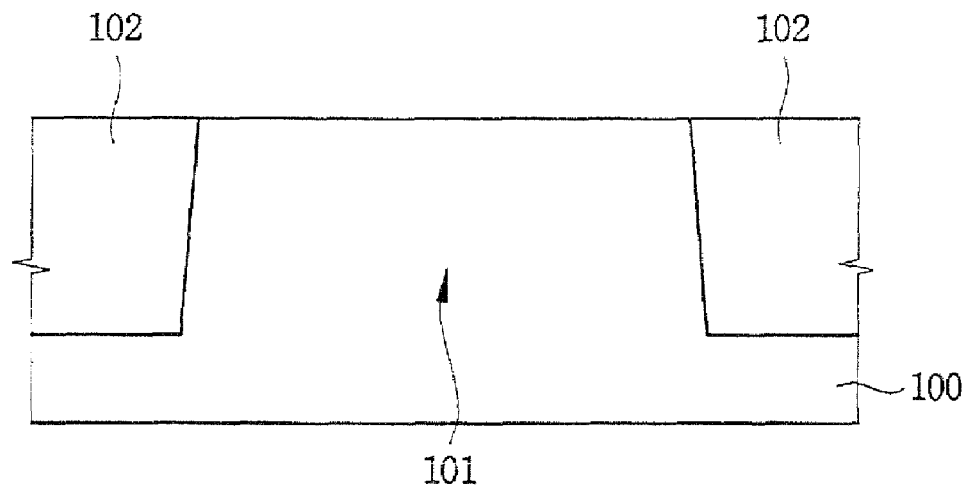
FIGS. 3A to 11B are plan diagrams and cross-sectional diagrams illustrating a method of manufacturing a semiconductor device according to another embodiment of the invention.
Figure 3C:
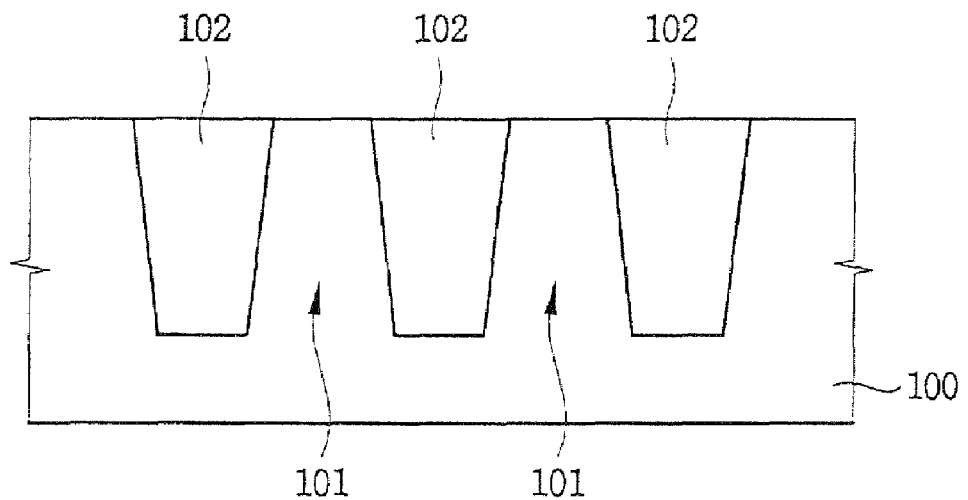

FIG. 3A is a plan diagram of a substrate 100 on which active regions 101 are defined and FIGS. 3B and 3C are cross-sectional diagrams taken along lines A-A' and B-B' in FIG. 3A. Referring to FIGS. 3A, 3B, and 3C, the semiconductor substrate 100 is divided into the active regions 101 and isolation regions 102 by a shallow trench isolation (STI) process. Preferably, as shown in FIG. 3A, the active regions 101 are roughly pill-shaped, with thickened middle portions. Alternatively, the active regions 101 are substantially rectangular shaped or substantially T-shaped.

At least two separate contact regions will be formed in each active regions in a successive process.

Figure 4B:
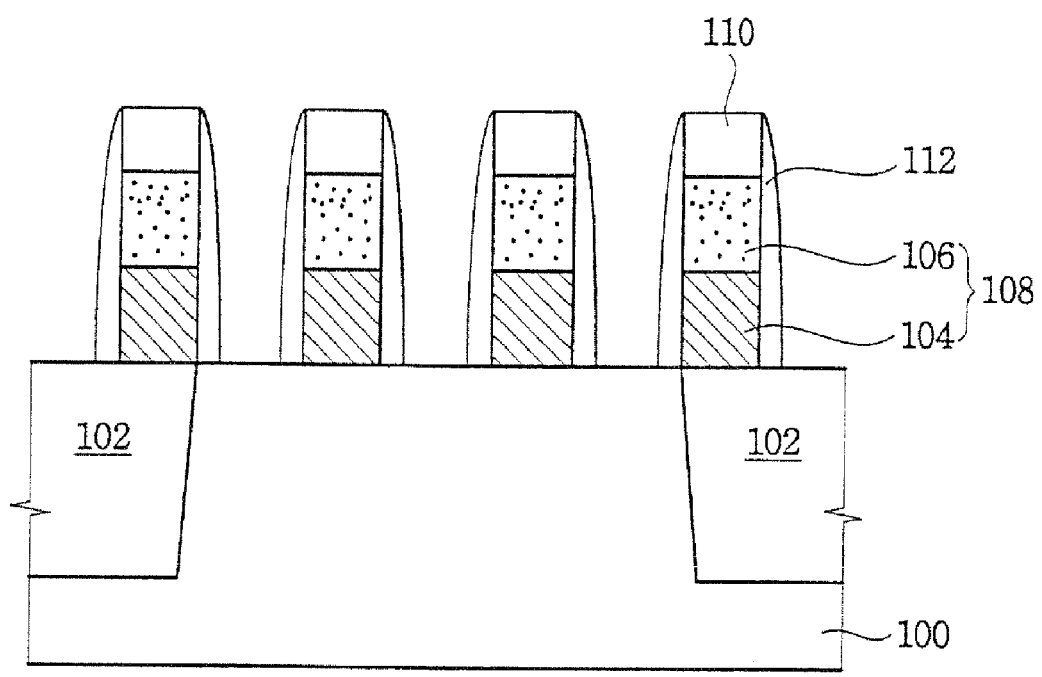
Figure 4C:
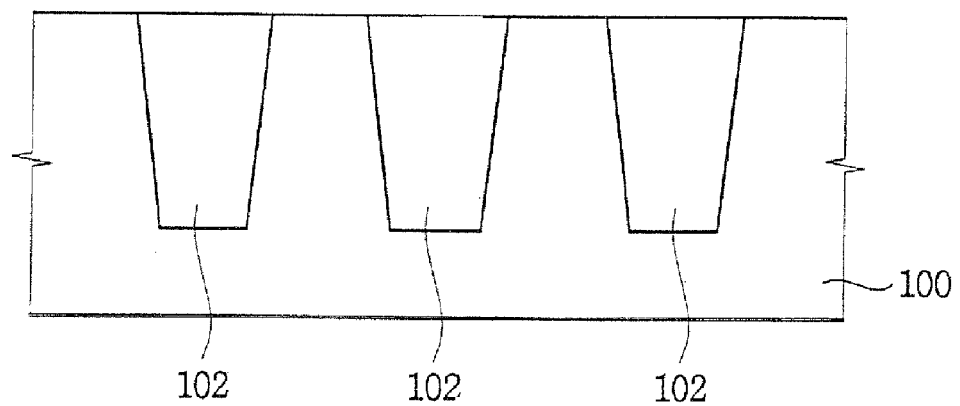

FIG. 4A is a plan diagram of the substrate 100 on which gate lines 108 are formed and FIGS. 4B and 4C are cross-sectional diagrams taken along lines A-A' and B-B' in FIG. 4A.

Referring to FIGS. 4A to 4C, after growing a thin gate oxide layer (not shown) on the surface of the active regions 101 by a thermal oxidation process, a first conductive layer for gate electrodes and a gate mask layer are sequentially formed on the gate oxide layer. Preferably, the first conductive layer includes a doped polysilicon layer and a metal silicide layer stacked on the polysilicon layer. The gate mask layer is composed of a material having an etching selectivity relative to an interlayer dielectric layer successively formed in a subsequent process. Preferably, the gate mask layer is formed using a silicon nitride based material.

The gate mask layer and the first conductive layer are patterned via a photolithography process to form the gate lines 108 on the semiconductor substrate 100. Each of the gate lines 108 includes a doped polysilicon layer pattern 104, a metal silicide layer pattern 106, and a gate mask layer pattern 110. Particularly, after forming first photoresist patterns (not shown) on the gate mask layer, the gate mask layer is dry etched using the first photoresist patterns as etching masks to form the gate mask layer patterns 110. The first photoresist patterns are removed via an ashing process and a stripping process. The first conductive layer is dry etched using the gate mask layer patterns 110 as masks to form a plurality of gate lines 108 including the doped polysilicon layer patterns 104 and the metal silicide layer patterns 106.

The gate lines 108 pass through in the active regions 101 serve as gate electrodes of MOS transistors, respectively.

An insulating layer is formed on the surface of the substrate 100 having the gate lines 108 formed thereon. The insulating layer is formed using a material having an etching selectivity relative to the interlayer dielectric layer subsequently formed. Preferably, the insulating layer includes a silicon nitride based material. The insulating layer is then anisotropically etched to form gate spacers 112 on the sidewalls of the gate lines 108. As a result, one gate line 108 is electrically isolated from an adjacent gate line 108 because the top faces and the sidewalls of the gate lines 108 are surrounded with the insulating layer patterns, i.e., the gate mask layer patterns 110 and the gate spacers 112.

Source/drain regions (not shown) are formed in the active regions 101 exposed between the gate spacers 112 by an ion implantation process. Here, before forming the gate spacers 112, a lightly doped drain (LDD) ion implantation process may be carried out to form lightly doped source/drain regions in the active region 101 exposed between the gate lines 108, thereby accomplishing the source/drains having LDD structures.

Some of the source/drain regions correspond to storage node contact regions connected to storage electrodes of capacitors while other source/drain regions correspond to bit line contact regions connected to bit lines that are subsequently formed. In the present embodiment, the source regions become storage node contact regions and the drain regions become bit line contact regions. Two storage node contact regions and one bit line contact region are formed in one active region 101 because the storage node contact regions and the bit line contact region are formed between adjacent gate lines 108 passing through active region 101.

Figure 5A:
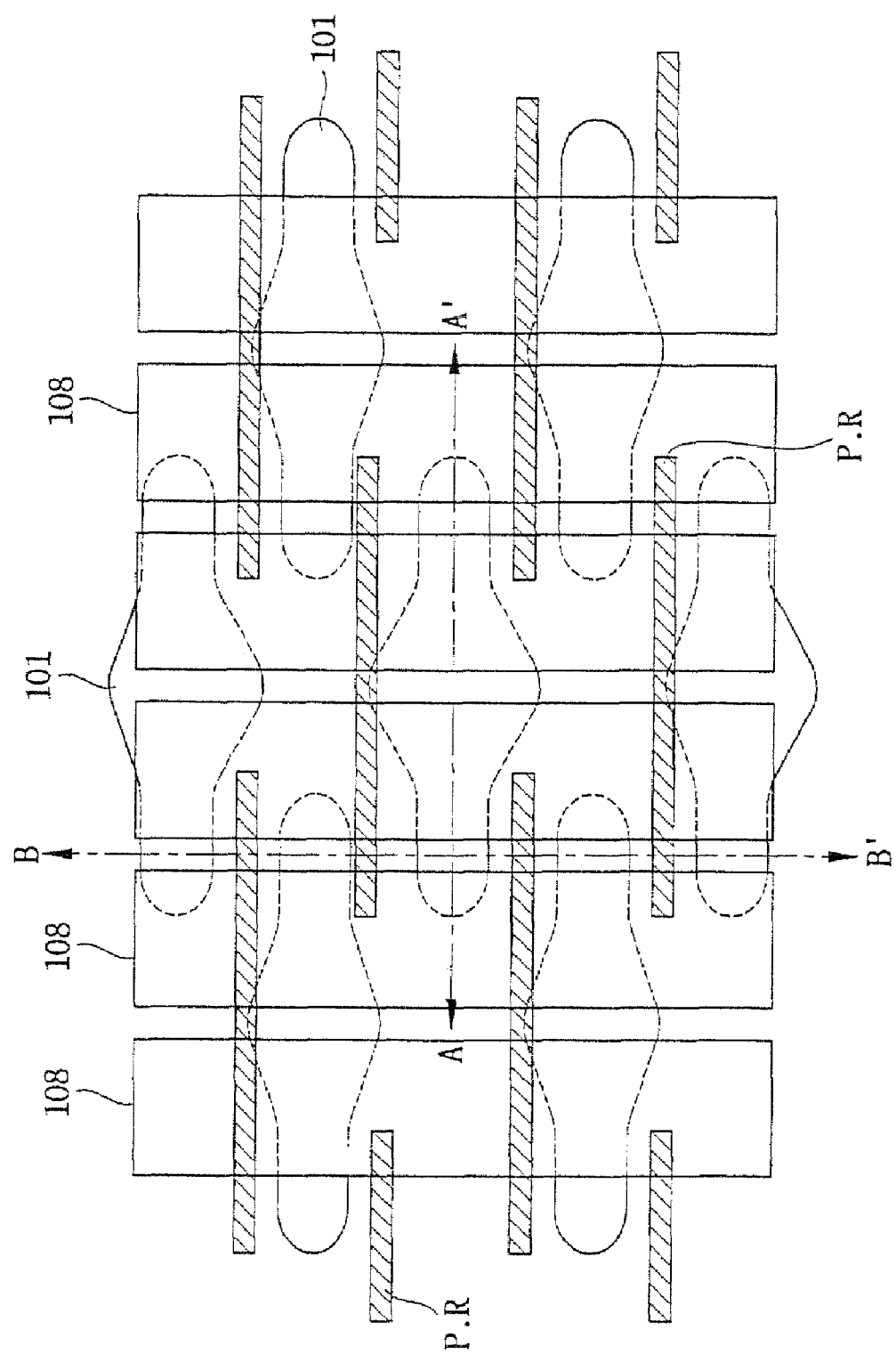
Figure 5B:
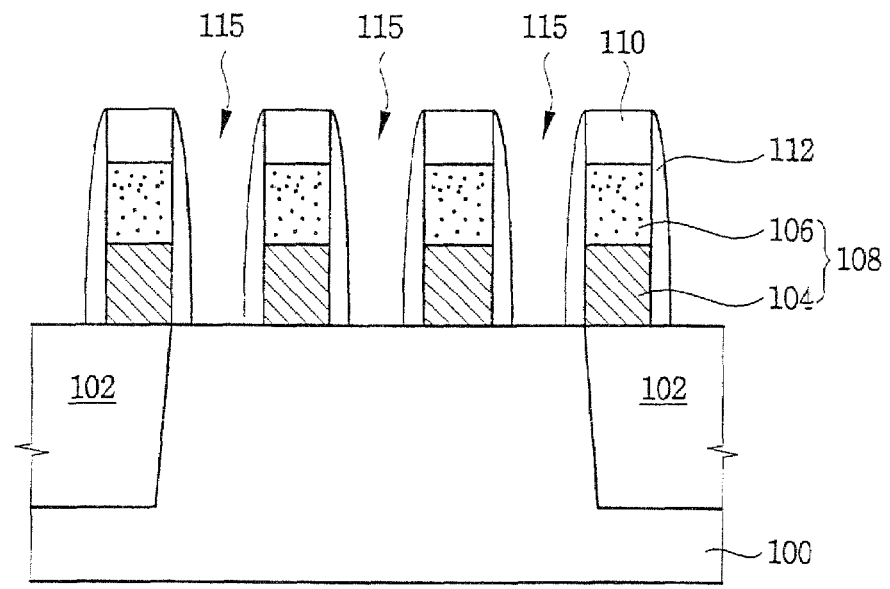
Figure 5C:
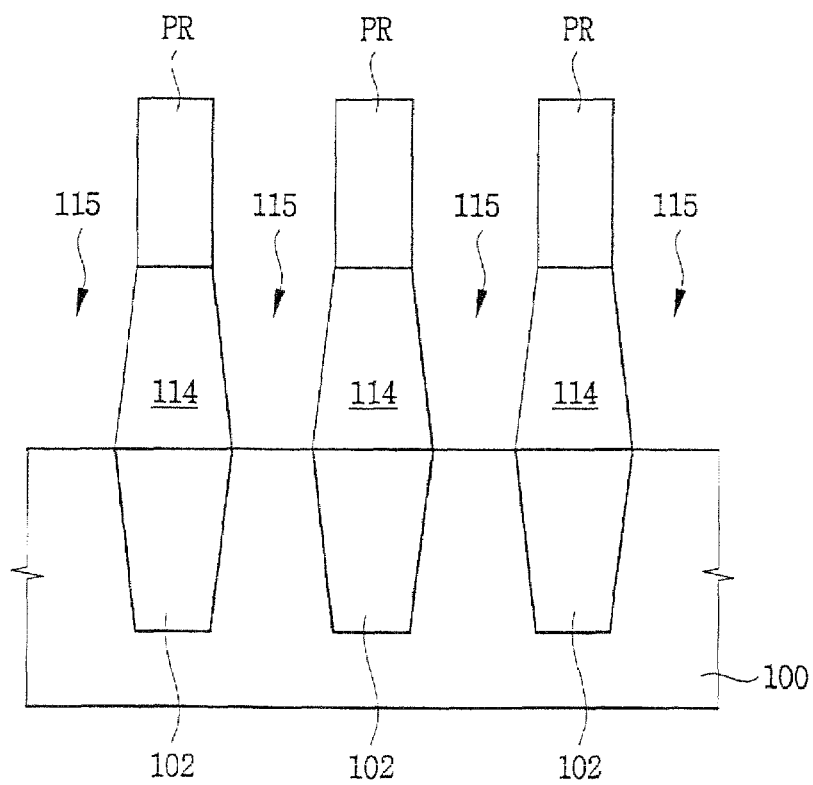

FIG. 5A is a plan diagram of the substrate where SAC mask patterns are formed and FIGS. 5B and 5C are cross-sectional diagrams taken along lines A-A' and B-B' in FIG. 5A.

Referring to FIGS. 5A to 5C, a first interlayer dielectric layer 114 including a silicon oxide based material is formed on the substrate 100 including the MOS transistors formed thereon. After forming the first interlayer dielectric layer 114, the surface of the first interlayer dielectric layer 114 may be planarized to ensure the process margin of a subsequent photo process by a CMP process, an etch-back process, or a mixed process of a CMP and an etch-back.

The first interlayer dielectric layer 114 is anisotropically etched using SAC mask patterns, e.g., second photoresist patterns having bar shapes that include openings 115 exposing the active regions 101 when the surfaces of the storage node contact regions and the bit line contact regions are exposed between the gate lines 108.

Figure 6A:
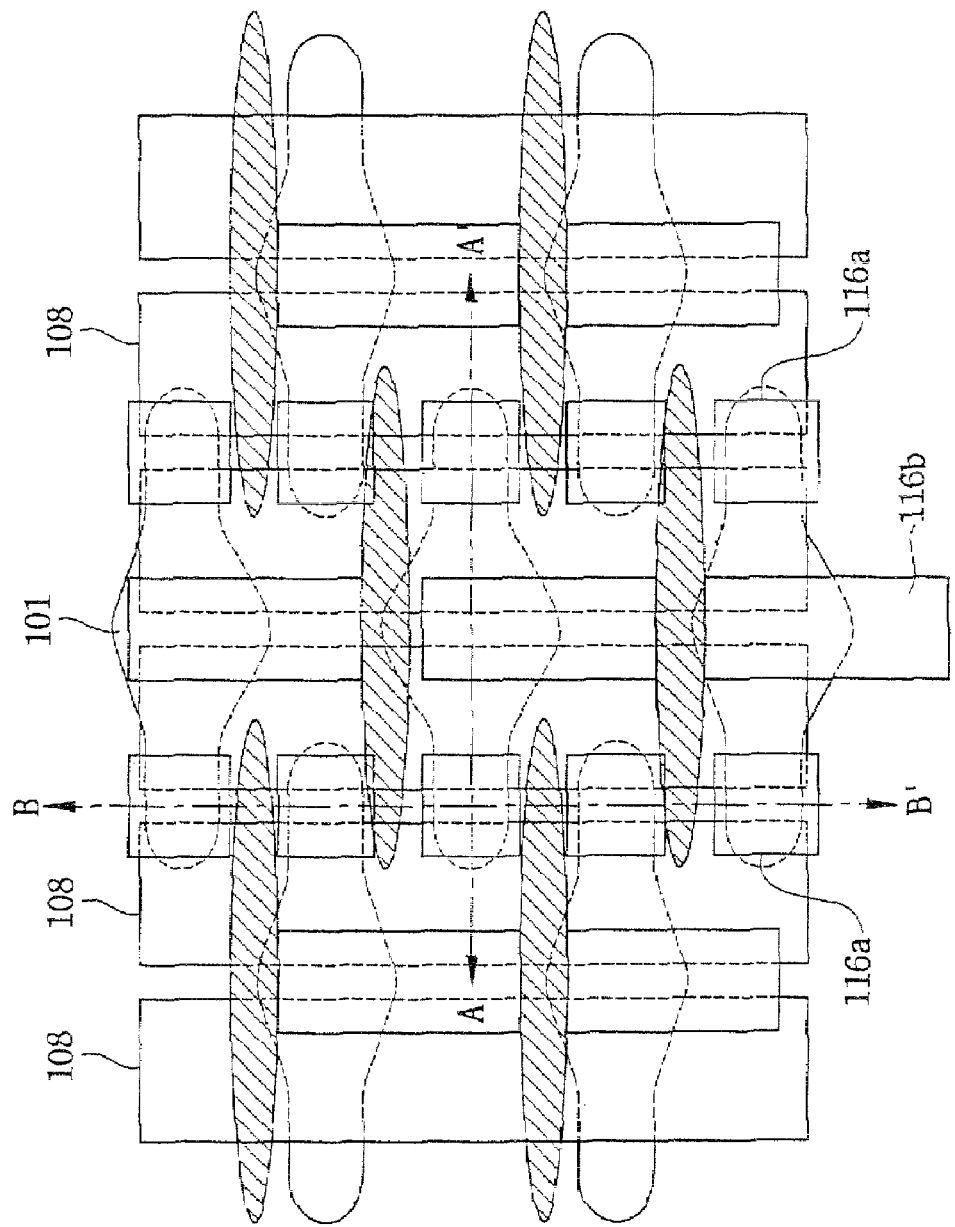
Figure 6B:
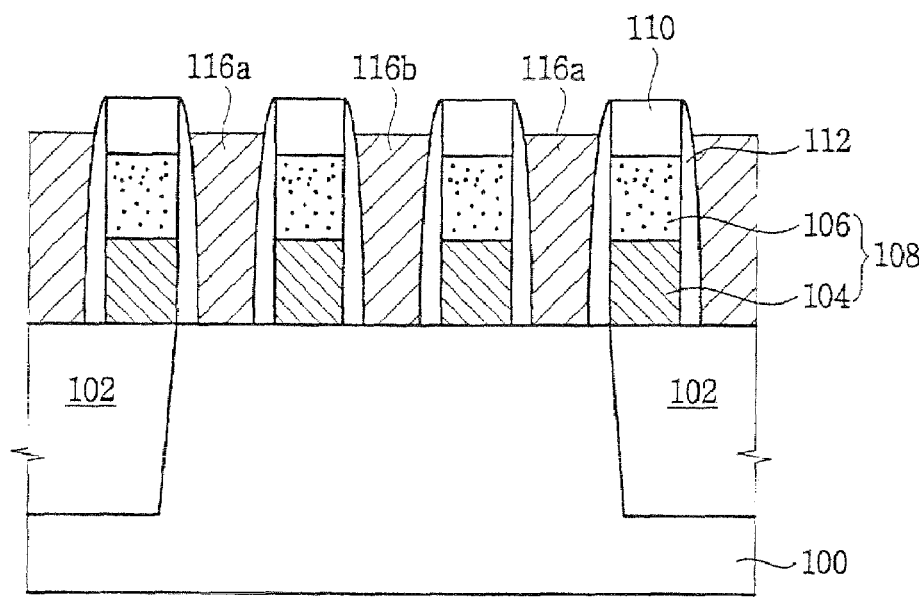
Figure 6C:
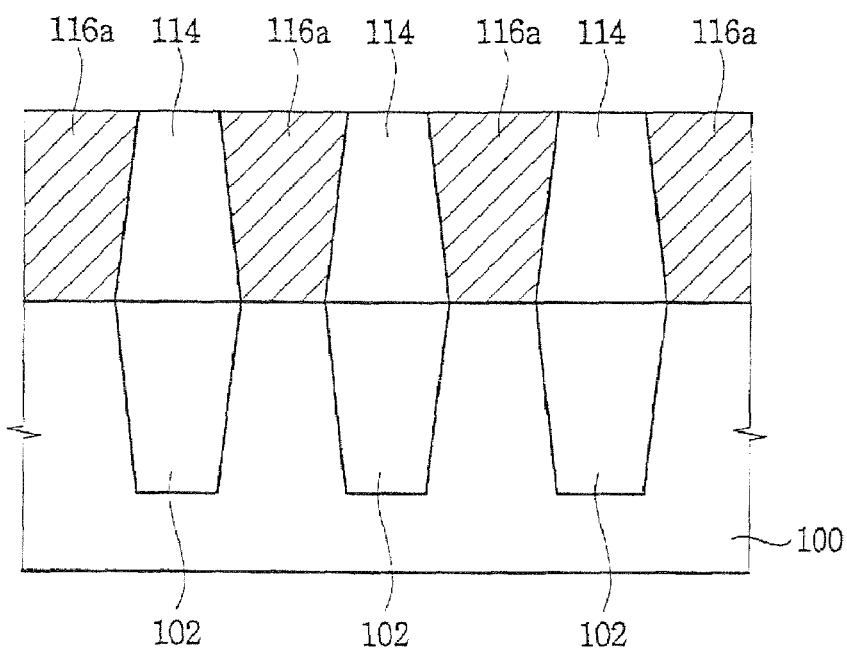

FIG. 6A is a plan diagram of the substrate 100 on which first and second contact pads 116a and 116b are formed, and FIGS. 6B and 6C are cross-sectional diagrams taken along lines A-A' and B-B' in FIG. 6A.

Referring to FIGS. 6A to 6C, a second conductive layer, e.g., a polysilicon layer doped with an impurity at a high concentration, is formed on the first interlayer dielectric layer 114 to fill up the openings 115. The second conductive layer and the first interlayer dielectric layer 114 are then planarized when the surfaces of the gate mask layer patterns 110 are exposed, thereby forming at least two different contact pads separated into node units in the openings 115, e.g., the first contact pads 116a and the second contact pads 116b. The first contact pads 116a make contact with the storage node contact regions while the second contact pads 116b make contact with the bit line contact regions.

Preferably, the planarization of the second conductive layer is performed via a CMP process, an etch-back process or a mixed process of a CMP and an etch-back.

Figure 7B:
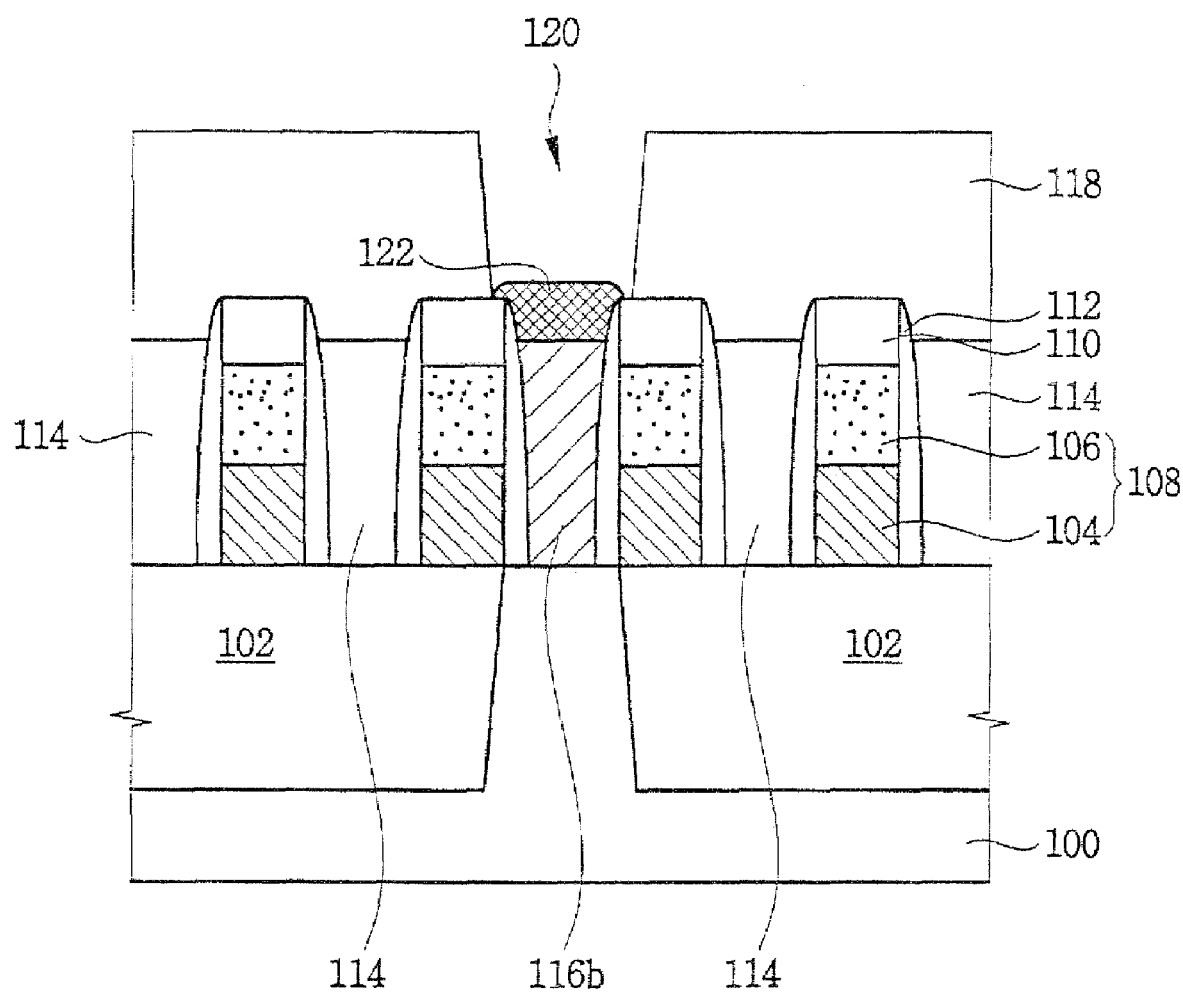
Figure 7C:
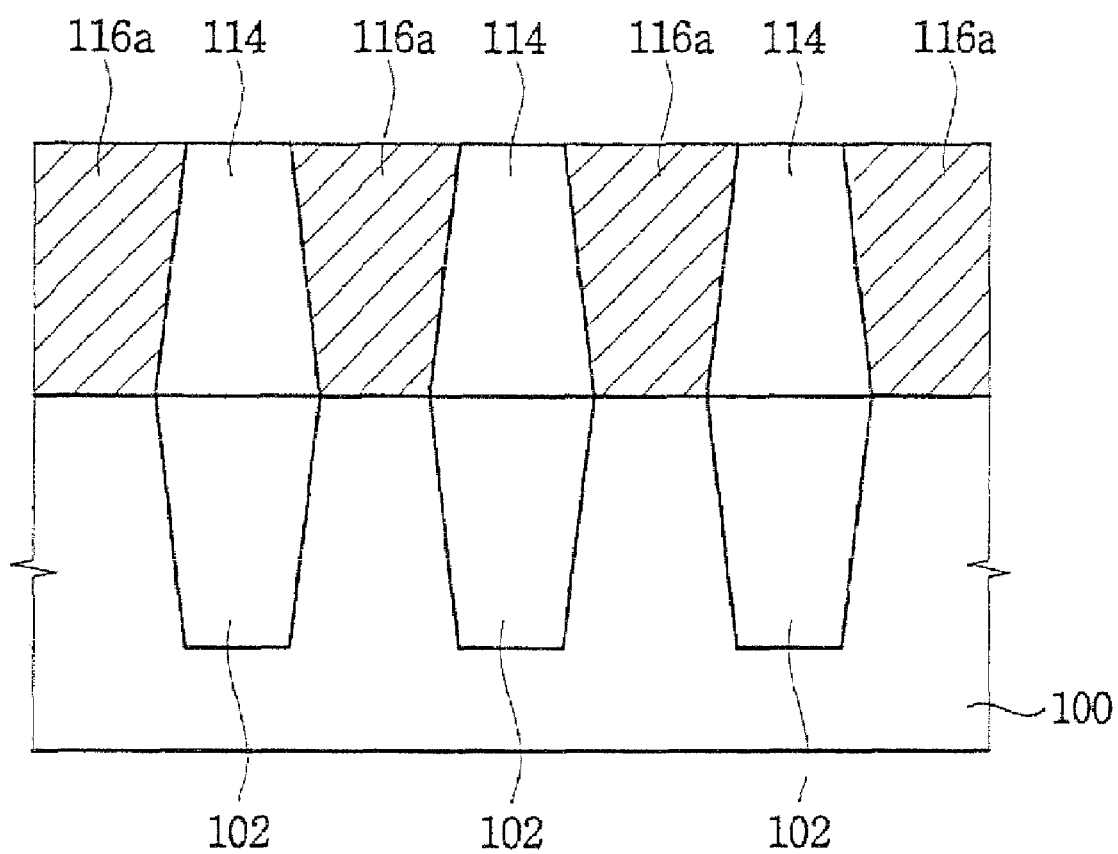

FIG. 7A is a plan diagram of the substrate 100 where bit line contact holes 122 are formed and FIGS. 7B and 7C are cross-sectional diagrams taken along lines A-A' and B-B' in FIG. 7A.

Referring to FIGS. 7A to 7C, after forming the first and second contact pads 116a and 116b, a silicon oxide based material such as borophosphorous silicate glass (BPSG), undoped silicate glass (USG), high density plasma (HDP) oxide, chemical vapor deposition (CVD) oxide, etc., is deposited to form a second interlayer dielectric layer 118. The second interlayer dielectric layer 118 electrically isolates the contact pads 116a and 116b from the bit lines successively formed thereon.

After forming the second interlayer dielectric layer 118, the surface of the second interlayer dielectric layer 118 may be planarized by a CMP or an etch-back process to ensure the process margin of a subsequent photo process.

The second interlayer dielectric layer 118 is partially etched by a photolithography process, thereby forming the bit line contact holes 122 exposing the second contact pads 116b on the bit line contact regions. A first selective epitaxial silicon layer 122 is formed on the second contact pads 116b exposed through the bit line contact holes 120. The first selective epitaxial silicon layer 122 is thick enough to cover the gate mask layer patterns 110. For example, the first selective epitaxial silicon layer 122 has a thickness of approximately 500 Å. The first selective epitaxial silicon layer 122 protects the underlying gate mask layer patterns 110 during a subsequent etching process.

Figure 8B:
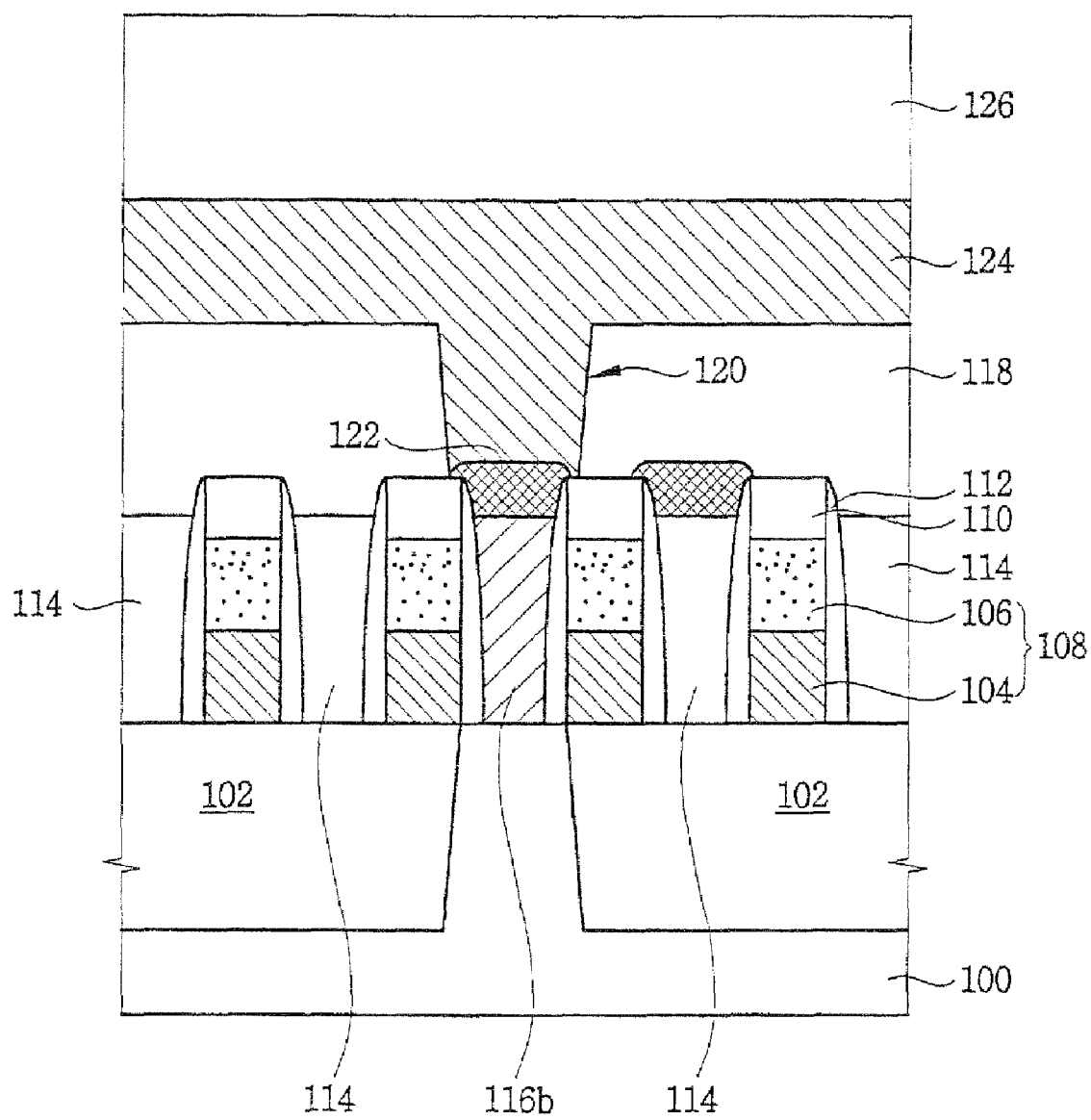
Figure 8C:
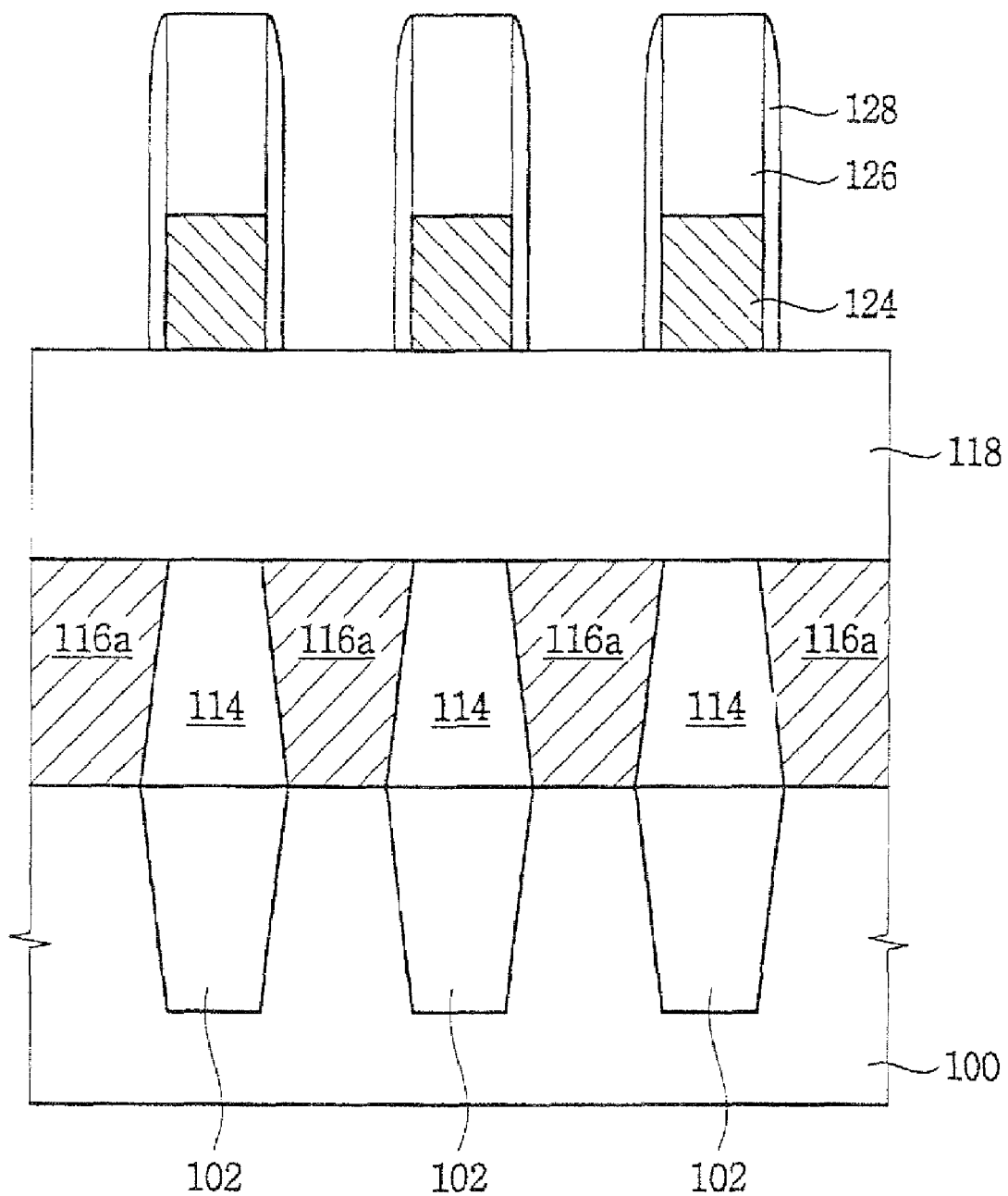

FIG. 8A is a plan diagram of the substrate 100 on which the bit lines 124 are formed and FIGS. 8B and 8C are cross-sectional diagrams taken along lines A-A' and B-B' in FIG. 8A.

Referring to FIGS. 8A to 8C, after forming the first selective epitaxial silicon layer 122 on the exposed surfaces of the first contact pads 116b, a third conductive layer for the bit lines 124 and bit line mask layer patterns 126 are sequentially formed on the second interlayer dielectric layer 118 to fill up the bit line contact holes 120, respectively. Preferably, the third conductive layer may be formed to have a composite layer including a first film composed of a first metal and/or a compound of the first metal, e.g., titanium (Ti)/titanium nitride (TiN), and a second film composed of a second metal, e.g., tungsten (W). The bit line mask layer patterns 126 protect the underlying bit line 124 during a subsequent etching process for forming contacts. Each of the bit line mask layer patterns 126 is formed using a silicon nitride based material.

In accordance with the above-described steps, the third conductive layer including the dual films makes direct contact with the bit line contact holes 120. Alternatively, bit line contact plugs may be additionally formed in the bit line contact holes 120 and the third conductive layer may make direct contact with the bit line contact plugs.

Particularly, a barrier metal layer including Ti/TiN and a third metal layer including W are formed in the bit line contact holes 120 and on the second interlayer dielectric layer 118. The third metal layer is then removed via a CMP process or an etch-back process when the surface of the second interlayer dielectric layer 118 is exposed. As a result, the bit line contact plugs including the barrier metal layer and the third metal layer are formed in the bit line contact holes 120, respectively.

After forming the bit line contact plugs, the third conductive layer composed of a fourth metal, e.g., W, and the bit line mask layer are sequentially formed on the bit line contact plugs and on the second interlayer dielectric layer 118. The third conductive layer corresponds to a bit line conductive layer. When the bit line contact plugs are formed in the bit line contact holes 120, the bit line conductive layer is formed to have a single film.

After third photoresist patterns are formed on the bit line mask layer, the bit line mask layer is dry etched using the third photoresist patterns as etching masks so that bit line mask patterns 126 are formed. After removing the third photoresist patterns by an ashing process and a stripping process, the third conductive layer is dry etched using the bit line mask layer patterns 126 as etching masks, thereby forming a plurality of the bit lines 120 electrically connected to the first contact pads 116b through the bit line contact holes 120. Each of the bit lines 124 extends in a direction perpendicular to the gate line 108.

Alternatively, before forming the third photoresist patterns, an anti-reflective layer may be formed on the bit line mask layer so as to improve the photolithography process. The anti-reflective layer may be formed to have a single film of silicon oxynitride (SiON) or a number of films including high temperature oxide (HTO) films and SiON films. The anti-reflective layer prevents the lights from being reflected from the lower substrate 100 during the photolithography process, which facilitates the formation of the photoresist patterns.

After forming the bit lines 124, a silicon nitride layer is formed on the surface of a resultant structure and is then anisotropically etched to form bit line spacers 128 on the sidewalls of the bit lines 124, Preferably, the bit line spacer 128 has a thickness of about 100~200 Å.

Figure 9B:
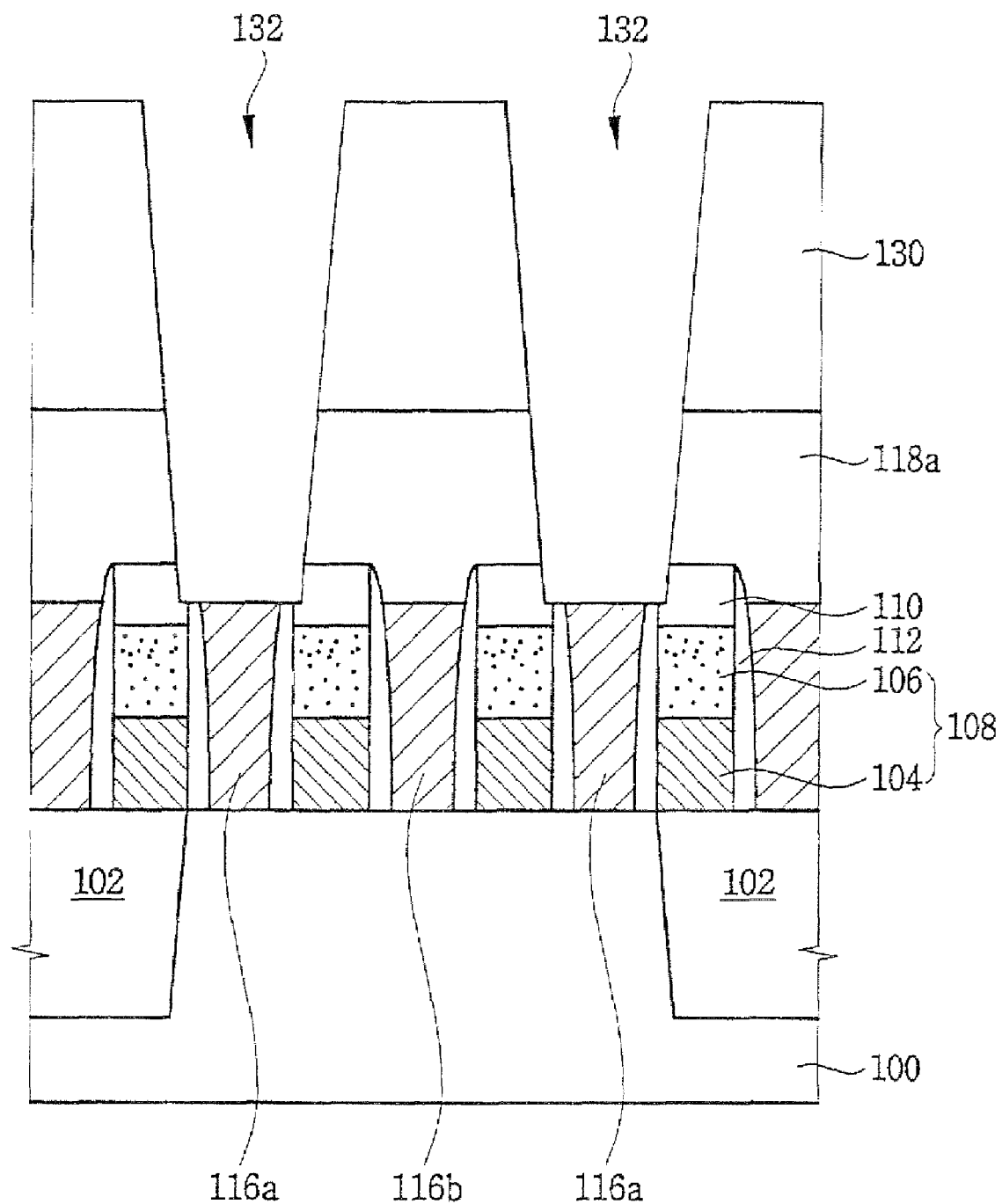
Figure 9C:
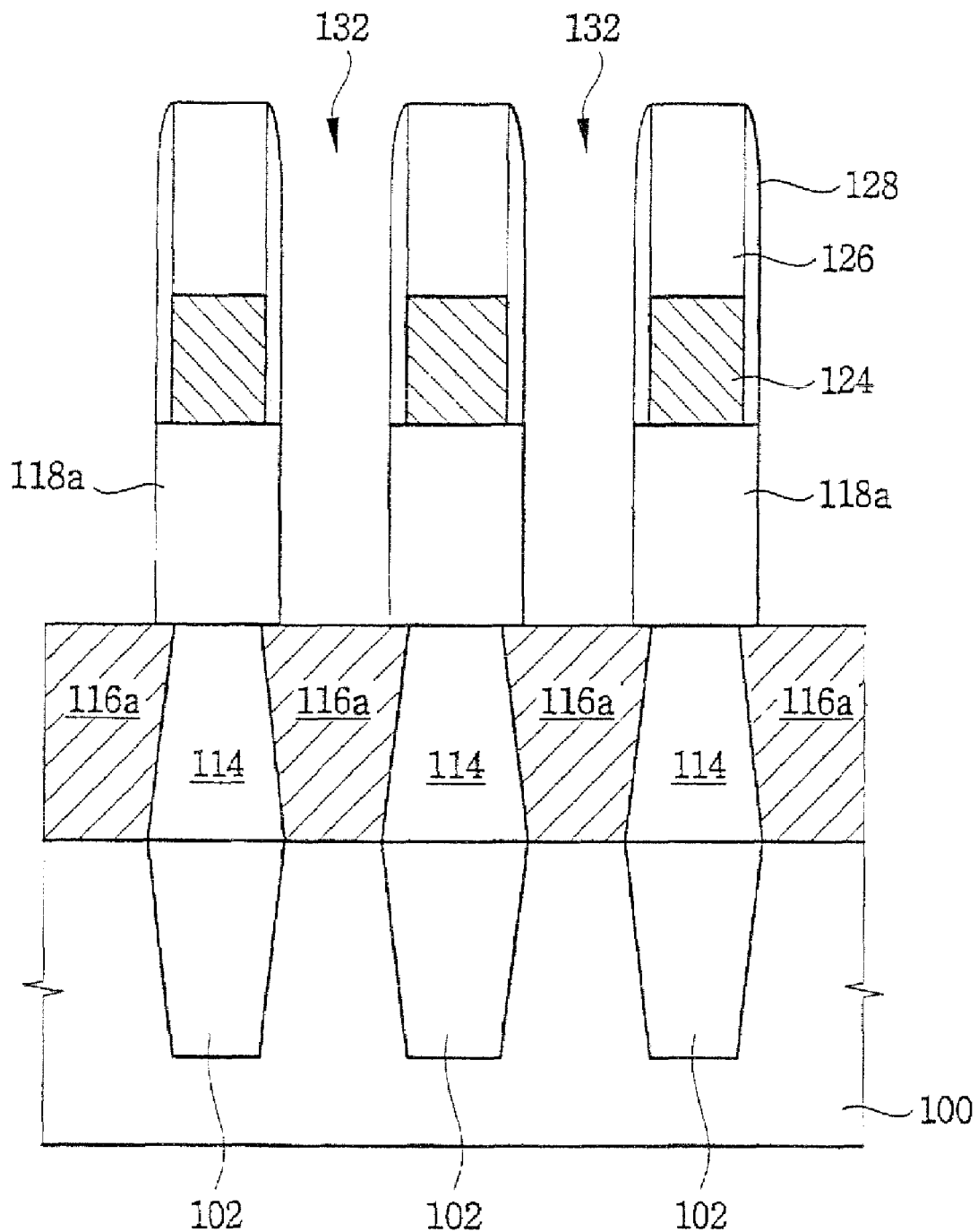

FIG. 9A is a plan diagram of the substrate 100 where storage node contact holes 132 are formed and FIGS. 9B and 9C are cross-sectional diagrams taken along lines A-A' and B-B' in FIG. 9A.

Referring to FIGS. 9A to 9C, after forming the bit lines 124 surrounded by the bit line mask layer patterns 126 and the bit line spacers 128, a silicon oxide based material such as BPSG, USG, HDP oxide, CVD oxide, etc., is deposited on the surface of a resultant structure, thereby forming a third interlayer dielectric layer 130. The third interlayer dielectric layer 130 electrically isolates the bit lines 124 from storage node contact plugs that successively formed in a subsequent process.

After forming the third interlayer dielectric layer 130, the surface of the third interlayer dielectric layer 130 is planarized by a CMP process or an etch-back process so as to ensure the process margin of a subsequent photo process. The third interlayer dielectric layer 130 and the second interlayer dielectric layer 118 are partially etched via a photolithography process, thereby forming the storage node contact holes 132 exposing the first contact pads 116a on the storage node contact regions. Here, the reference numeral 118a indicates the remaining second interlayer dielectric layer after the etching process.

In particular, with a photo process, there are formed fourth photoresist patterns (not shown) having line shapes that extend in a direction substantially parallel to the gate lines 108. The third interlayer dielectric layer 130 and the second interlayer dielectric layer 118 are anisotropically etched using the fourth photoresist patterns as etching masks. Here, the third and second interlayer dielectric layers 130 and 118 are etched using an etching gas having a high etching selectivity relative to the silicon nitride layer patterns, i.e., the bit line mask layer patterns 126 and the bit line spacers 128. As a result, there are formed the storage node contact holes 132 having the line shapes exposing the first contact pads 116a located between adjacent bit lines 124. That is, all the storage node contact holes 132 are formed to have the line shape such that the first contact pads 116a and an adjacent first contact pads 116a are simultaneously exposed in the direction parallel to the gate lines 108.

Figure 10A:
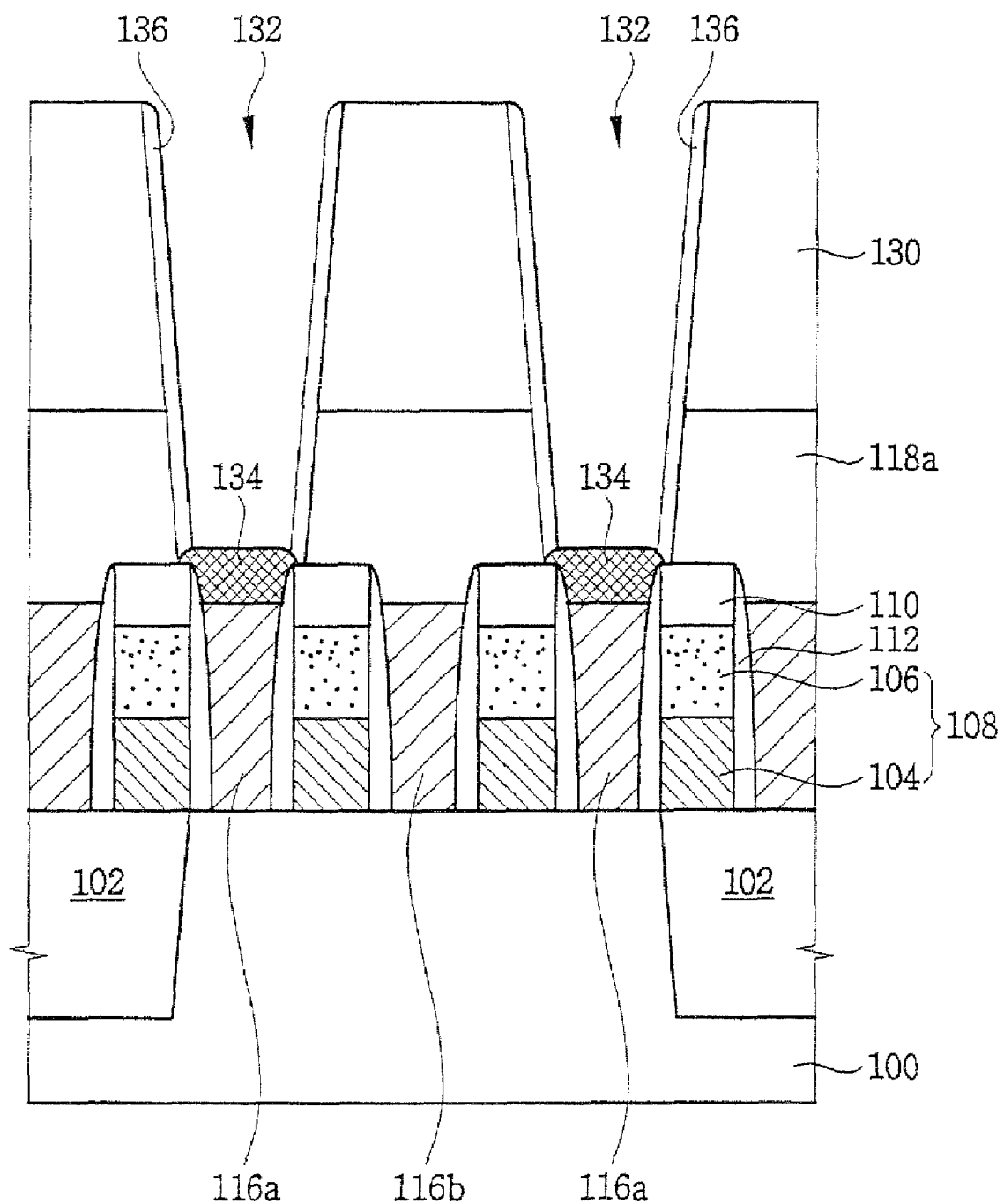
Figure 10B:
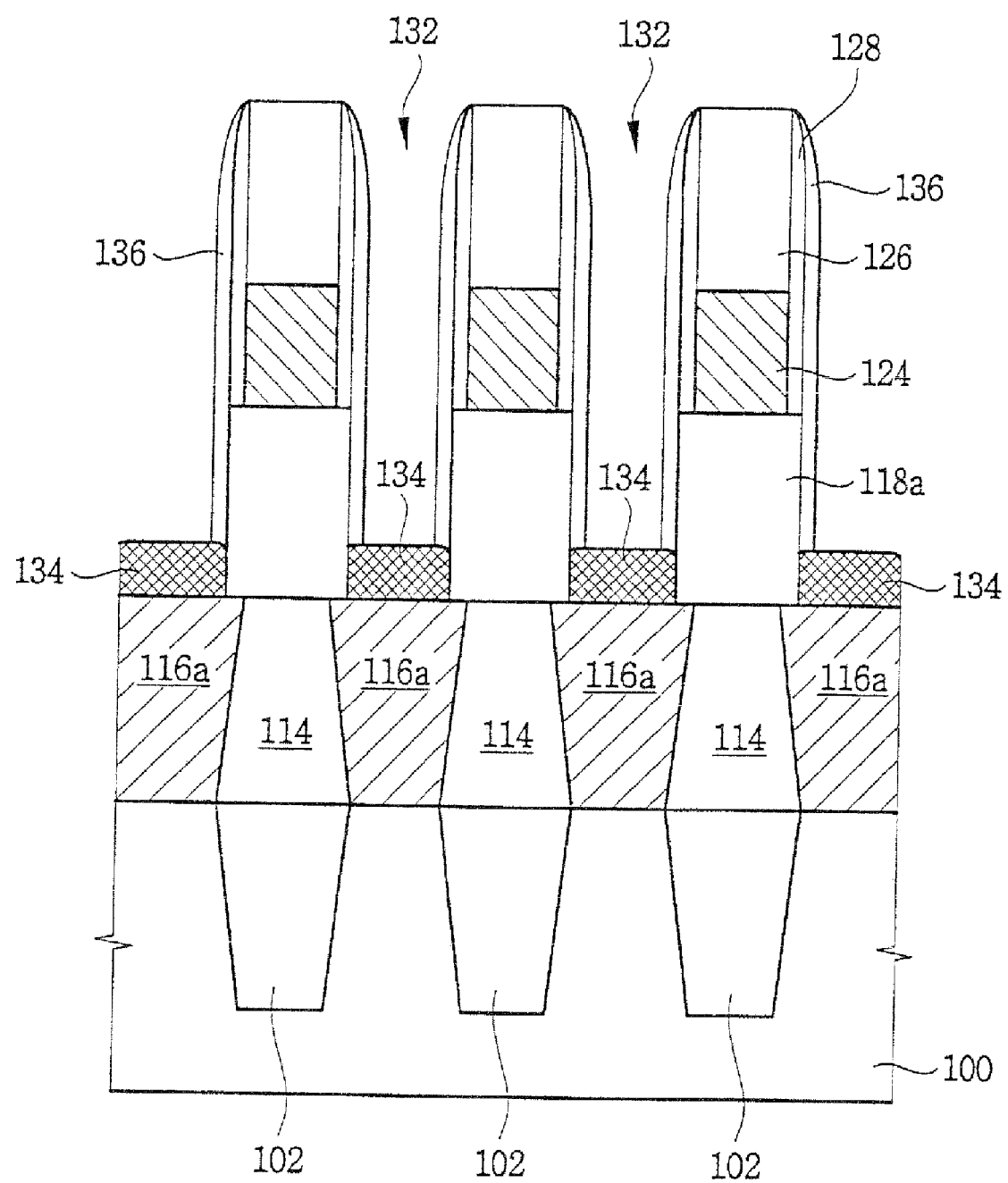

FIGS. 10A and 10B are cross-sectional diagrams taken along lines A-A' and B-B' in FIG. 9A and illustrate steps of forming second selective epitaxial silicon layers 134 and contact spacers 136.

Referring to FIGS. 10A and 10B, after forming the storage node contact holes 132 having the line shapes, the fourth photoresist patterns are removed by an ashing process and a stripping process.

Second selective epitaxial layers 134 are formed on the exposed first contact pads 116a. Each of the second selective epitaxial layers 134 has a thickness of approximately 500 Å that is enough to cover the gate mask layer patterns 110.

An insulating layer is formed on a resultant structure using a material having an etching selectivity relative to the third interlayer dielectric layer, e.g., a silicon nitride based material. The insulating layer is anisotropically etched using the second selective epitaxial silicon layers 134 as etching stoppers to form the contact spacers 136 on the inner sidewalls of the storage node contact holes 132, respectively. Here, the contact spacers 136 are formed on the sidewalls of the remaining second interlayer dielectric layer 118a and the bit line spacers 128. The contact spacers 136 prevent the bit lines 124 from being electrically short-circuited with storage node contact plugs that are successively formed in the storage node contact holes 132. During the etching process for forming the contact spacers 136, the second selective epitaxial silicon layers 134 formed on the first contact pad 116a protect the gate mask layer patterns 110 enclosing the gate lines 108.

Figure 11A:
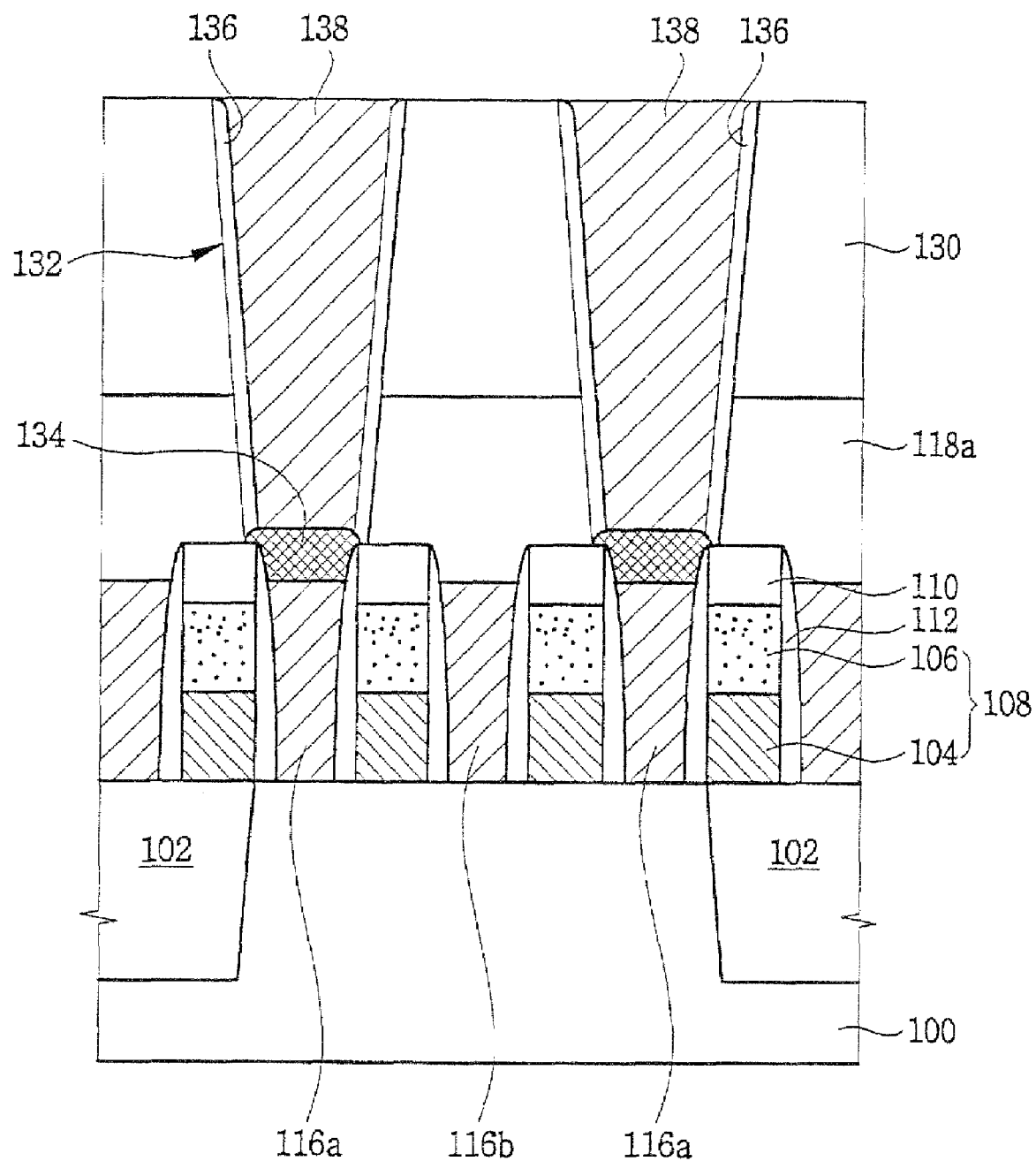
Figure 11B:
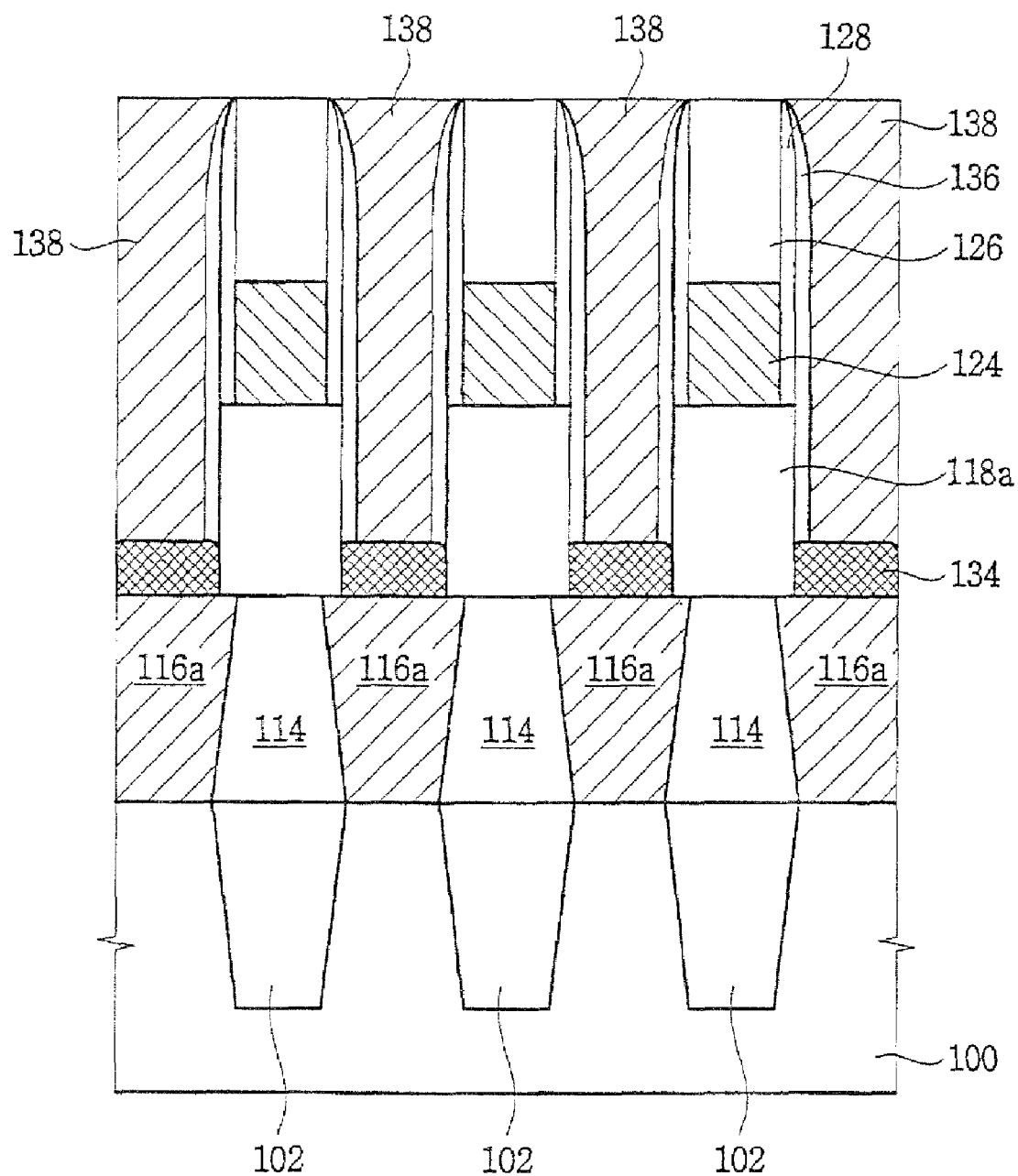

FIGS. 11A and 11B are cross-sectional diagrams taken along lines A-A' and B-B' in FIG. 9A and illustrate steps of forming the storage node contact plugs 138.

Referring to FIGS. 11A and 11B, after forming the contact spacers 136, a fourth conductive layer, e.g., a doped polysilicon layer, is formed on the third interlayer dielectric layer 130 to fill the storage node contact holes 132. The fourth conductive layer is then planarized by a CMP or an etchback process when the upper surface of the third interlayer dielectric layer 130 is exposed, thereby forming the storage node contact plugs 138 separated into node units in the storage node contact holes 132, respectively.

Thereafter, capacitors (not shown) are formed that have storage electrodes, dielectric layers, and plate electrodes, using a capacitor forming process.

According to this embodiment, during the etching process for forming the contact spacers 136 that prevent the electrical short-circuit between the bit lines 124 and the storage node contact plugs 138, the selective epitaxial silicon layers 134 formed on the contact pads 116a and 116b prevent the gate mask layer patterns 110 that enclose the gate lines 108 from being etched. Hence, the electrical short-circuit between the gate line 108 and the bit line 124 or between the gate line 108 and the storage node contact plug 138 can be prevented.

According to embodiments of the invention, after forming the contact holes exposing the SAC pads, the selective epitaxial silicon layers are grown on the contact pads exposed through the contact holes to cover the insulating mask layer patterns that enclose the underlying wirings. Thus, the selective epitaxial silicon layers protect the insulating mask layer patterns during successive etching processes, thereby preventing the lower wirings from being electrically short-circuited with the upper wirings that are formed in the contact holes.

Embodiments of the invention will now be described in a non-limiting way.

In accordance with one aspect of the invention, there is provided a semiconductor device including a semiconductor substrate and wirings formed on the substrate and separated from each other. Each of the wirings includes a first conductive layer pattern and an insulating mask layer pattern formed on the first conductive layer pattern. Insulating spacers are formed on sidewalls of the wirings. SAC pads including portions of a second conductive layer are formed to fill a gap between the wirings. An interlayer dielectric layer having contact holes that expose the contact pads are formed on the contact pads, the wirings and the substrate. A selective epitaxial silicon layer is formed on the contact pads exposed through the contact holes to cover the insulating mask layer pattern.

Preferably, the insulating mask layer pattern and the insulating layer spacers include silicon nitride based materials.

In accordance with another aspect of the invention, wirings including first conductive layer patterns and insulating mask layer patterns are formed on a substrate. The wirings are separated from each other. Insulating spacers are formed on sidewalls of the wirings. SAC pads including portions of a second conductive layer are formed to fill a gap between the wirings. An interlayer dielectric layer is formed on the substrate wherein the contact pads are formed. The interlayer dielectric layer is partially etched to form contact holes exposing the contact pads. A selective epitaxial silicon layer is formed on the contact pads exposed through the contact holes to cover the insulating mask layer patterns.

In accordance with still another aspect of the invention, wirings are formed on a semiconductor substrate and separated from each other. Each of the wirings includes a first conductive layer pattern and an insulating mask layer pattern formed on the first conductive layer pattern. Insulating spacers are formed on sidewalls of the wirings. Using mask patterns of bar type having openings including at least two different contact regions, there are formed at least two different SAC pads making contact with portions of a surface of the substrate between the wirings. An interlayer dielectric layer is formed on the substrate where at least two different SAC pads are formed. The interlayer dielectric layer is partially etched to form a contact hole exposing one of the at least two SAC pads. A selective epitaxial silicon layer is formed on one of the at least SAC pads to cover the insulating mask layer pattern.

Preferably, a first interlayer dielectric layer is formed on the insulating layer spacers, the wirings and the substrate. The first interlayer dielectric layer is etched using the insulating mask pattern until the portions of the substrate between the wirings are exposed. After forming a second conductive layer on the first interlayer dielectric layer and the portions of the substrate between the wirings, the second conductive layer and the first interlayer dielectric layer are planarized until a surface of the insulating mask layer pattern is exposed.

Preferably, the contact hole is formed to have the line shapes so that one of the at least two SAC pads and another SAC pad arranged in a direction substantially parallel to the wirings are simultaneously exposed through the contact hole.

In accordance with yet another aspect of the invention, gate lines including gate mask layer patterns and gate spacers formed on sidewalls thereof are formed on a semiconductor substrate so that storage node contact regions and bit line contact regions are formed on portions of the substrate between the gate lines. First contact pads and second contact pads are formed using SAC mask patterns having bar shapes that include openings exposing the active regions. The first contact pads make contact with the storage node contact regions while the second contact pads make contact with the bit line contact regions. An interlayer dielectric layer is formed on the substrate where the first and second contact pads are formed. The interlayer dielectric layer is partially etched to form storage node contact holes having line shapes so that one first contact pad and an adjacent first contact pad arranged in a direction substantially parallel to the gate lines are exposed by each of the storage node contact holes. A selective epitaxial silicon layer is formed on the first contact pads exposed by the storage node contact holes to cover the gate mask layer patterns. Storage node contact plugs are formed in the storage node contact holes so that the storage node contact plugs are electrically connected to the first contact pads.

According to a different aspect of the invention, after forming the contact holes exposing the SAC pads, the selective epitaxial silicon layer is grown on the contact pads exposed through the contact holes to cover the insulating mask layer patterns enclosing the underlying wirings. Hence, the selective epitaxial silicon layer protects the insulating mask layer patterns during a subsequent etching process, thereby preventing lower wirings from being electrically short-circuited with upper wirings successively formed in the contact hole.

Preferred embodiments of the invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as defined in the following claims.

The invention claimed is:

1. A semiconductor device comprising:
   a semiconductor substrate;
   wirings formed on the substrate and separated from each other, each of the wirings including a first conductive layer pattern and an insulating mask layer pattern formed on the first conductive layer pattern;
   insulating spacers formed on sidewalls of the wirings;
   a self-aligned contact pad including a second conductive layer, the self-aligned contact pad being in contact with surfaces of the insulating spacers to fill a gap between the wirings;
   an interlayer dielectric layer formed on the contact pad, the wirings, and the substrate, the interlayer dielectric layer including a contact hole defined therein, wherein a sidewall of the contact hole extends from an upper surface of the insulating mask layer pattern to a height above the upper surface of the insulating mask layer pattern; and
   a selective epitaxial silicon layer formed within the contact hole, on the contact pad and covering the insulating mask layer pattern,
   wherein the sidewall of the contact hole is laterally adjacent to a lowermost portion of the selective epitaxial silicon layer covering the insulating mask layer pattern, and
   wherein an uppermost surface of the selective epitaxial silicon layer is lower than an uppermost surface of the interlayer dielectric.

2. The semiconductor device of claim 1, wherein the insulating mask layer pattern and the insulating spacers comprise materials having an etching selectivity relative to the interlayer dielectric layer.

3. The semiconductor device of claim 2, wherein the insulating mask layer pattern and the insulating spacers comprise silicon nitride based materials.

4. The semiconductor device of claim 1, wherein the second conductive layer comprises doped polysilicon.

5. The semiconductor device of claim 1, further comprising:
   a contact plug formed in the contact hole; and
   contact spacers formed on the selective epitaxial silicon layer between inner sidewalls of the contact hole and the contact plug.

6. The semiconductor device of claim 5, wherein the contact spacer comprises a material having an etching selectivity relative to the interlayer dielectric layer.

7. The semiconductor device of claim 6, wherein the contact spacers comprise silicon nitride based materials.

8. A semiconductor device comprising:
   a semiconductor substrate;
   wirings formed on the substrate and separated from each other, each of the wirings including a first conductive layer pattern and an insulating mask layer pattern formed on the first conductive layer pattern;
   insulating spacers formed on sidewalls of the wirings;
   self-aligned contact pads including portions of a second conductive layer, each of the self-aligned contact pads in contact with surfaces of the insulating spacers to fill a gap between the wirings;
   an interlayer dielectric layer formed on the contact pads, the wirings, and the substrate, the interlayer dielectric layer including contact holes that expose the contact pads, wherein the insulating mask layer pattern and the insulating spacers comprise materials having an etching selectivity relative to the interlayer dielectric layer; and
   a selective epitaxial silicon layer formed on the contact pads exposed through the contact holes to cover the insulating mask layer pattern.

9. The semiconductor device of claim 8, wherein the insulating mask layer pattern and the insulating spacers comprise silicon nitride based materials.

10. The semiconductor device of claim 8, wherein the second conductive layer comprises doped polysilicon.

11. The semiconductor device of claim 8, further comprising:
    contact plugs formed in the contact holes; and
    contact spacers formed on the selective epitaxial silicon layer between inner sidewalls of the contact holes and the contact plugs.

12. The semiconductor device of claim 11, wherein each of the contact spacers comprises a material having an etching selectivity relative to the interlayer dielectric layer.

13. The semiconductor device of claim 12, wherein the contact spacers comprise silicon nitride based materials.

14. A semiconductor device comprising:
    a semiconductor substrate;
    wirings formed on the substrate and separated from each other, each of the wirings including a first conductive layer pattern and an insulating mask layer pattern formed on the first conductive layer pattern;

insulating spacers formed on sidewalls of the wirings;

self-aligned contact pads including portions of a second conductive layer, each of the self-aligned contact pads in contact with surfaces of the insulating spacers to fill a gap between the wirings, wherein the second conductive layer comprises polysilicon;

an interlayer dielectric layer formed on the contact pads, the wirings, and the substrate, the interlayer dielectric layer including contact holes that expose the contact pads; and a selective epitaxial silicon layer formed on the contact pads exposed through the contact holes to cover the insulating mask layer pattern.

15. The semiconductor device of claim 14, wherein the insulating mask layer pattern and the insulating spacers comprise materials having an etching selectivity relative to the interlayer dielectric layer.

16. The semiconductor device of claim 15, wherein the insulating mask layer pattern and the insulating spacers comprise silicon nitride based materials.

17. The semiconductor device of claim 14, wherein the second conductive layer comprises doped polysilicon.

18. The semiconductor device of claim 14, further comprising:

contact plugs formed in the contact holes; and contact spacers formed on the selective epitaxial silicon layer between inner sidewalls of the contact holes and the contact plugs.

19. The semiconductor device of claim 18, wherein each of the contact spacers comprises a material having an etching selectivity relative to the interlayer dielectric layer.

20. The semiconductor device of claim 19, wherein the contact spacers comprise silicon nitride based materials.

21. The semiconductor device of claim 1, wherein the selective epitaxial silicon layer occupies less than an entirety of the contact hole.

* * * * *

UNITED STATES PATENT AND TRADEMARK OFFICE
CERTIFICATE OF CORRECTION

PATENT NO. : 7,342,275 B2 Page 1 of 1
APPLICATION NO. : 11/279080
DATED : March 11, 2008
INVENTOR(S) : Byung-Jun Park et al.

It is certified that error appears in the above-identified patent and that said Letters Patent is hereby corrected as shown below:

Column 8, line 33, the words "124, Preferably," should read -- 124. Preferably, --.

Signed and Sealed this

Ninth Day of September, 2008

JON W. DUDAS
*Director of the United States Patent and Trademark Office*